(12) United States Patent
Kang et al.

(10) Patent No.: US 11,941,293 B2
(45) Date of Patent: Mar. 26, 2024

(54) OPERATION METHOD OF STORAGE CONTROLLER USING HISTORY TABLE, AND STORAGE DEVICE INCLUDING THE STORAGE CONTROLLER

(71) Applicant: SAMSUNG ELECTRONICS CO., LTD., Suwon-si (KR)

(72) Inventors: Woohyun Kang, Hwaseong-si (KR); Hyuna Kim, Suwon-si (KR); Minkyu Kim, Suwon-si (KR); Donghoo Lim, Hwaseong-si (KR); Sanghyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 212 days.

(21) Appl. No.: 17/518,770

(22) Filed: Nov. 4, 2021

(65) Prior Publication Data
US 2022/0326884 A1  Oct. 13, 2022

(30) Foreign Application Priority Data

Apr. 8, 2021  (KR) .................. 10-2021-0045575

(51) Int. Cl.
| | |
|---|---|
| G06F 3/06 | (2006.01) |
| G06F 11/10 | (2006.01) |
| G06F 13/28 | (2006.01) |
| G11C 16/04 | (2006.01) |
| G11C 16/14 | (2006.01) |
| G11C 16/26 | (2006.01) |
| G11C 11/56 | (2006.01) |

(52) U.S. Cl.
CPC .......... *G06F 3/0659* (2013.01); *G06F 3/0604* (2013.01); *G06F 3/0679* (2013.01); *G06F 11/1068* (2013.01); *G06F 13/28* (2013.01); *G11C 16/0483* (2013.01); *G11C 16/14* (2013.01); *G11C 16/26* (2013.01); *G11C 11/5671* (2013.01)

(58) Field of Classification Search
CPC .. G06F 3/0604; G06F 3/0679; G06F 11/1068; G06F 13/28; G06F 3/0659; G11C 16/0483; G11C 16/14; G11C 16/26
See application file for complete search history.

(56) References Cited

U.S. PATENT DOCUMENTS

| | | | |
|---|---|---|---|
| 8,510,636 B2 | 8/2013 | Ruby et al. | |
| 9,036,412 B2 | 5/2015 | Choi et al. | |
| 9,606,864 B2 | 3/2017 | Lee et al. | |
| 9,645,177 B2 * | 5/2017 | Cohen | ................ G01R 19/0084 |

(Continued)

*Primary Examiner* — Tammara R Peyton
(74) *Attorney, Agent, or Firm* — Fish & Richardson P.C.

(57) ABSTRACT

A storage controller communicates with a non-volatile memory device, and an operation method of the storage controller includes determining whether a first read voltage is registered at a history table, when it is determined that the first read voltage is registered at the history table, performing a first direct memory access (DMA) read operation on data stored in the non-volatile memory device, based on the first read voltage, obtaining a page count value, based on the first DMA read operation, determining a second read voltage different from the first read voltage based on a difference between the page count value and an idle count value, without an additional read operation for the data stored in the non-volatile memory device, and updating the first read voltage of the history table based on the second read voltage.

20 Claims, 22 Drawing Sheets

(56) References Cited

U.S. PATENT DOCUMENTS

| | | |
|---|---|---|
| 10,108,370 B2 | 10/2018 | Hirano et al. |
| 10,120,589 B2 | 11/2018 | Jung |
| 10,490,285 B2 | 11/2019 | Yoon et al. |
| 10,581,458 B2 | 3/2020 | Lee |
| 2015/0117107 A1* | 4/2015 | Sun ..................... G11C 16/225 |
| | | 365/185.12 |
| 2020/0090763 A1 | 3/2020 | Tokutomi et al. |

* cited by examiner

OPERATION METHOD OF STORAGE CONTROLLER USING HISTORY TABLE, AND STORAGE DEVICE INCLUDING THE STORAGE CONTROLLER

CROSS-REFERENCE TO RELATED APPLICATION

This application claims priority under 35 U.S.C. § 119 to Korean Patent Application No. 10-2021-0045575 filed on Apr. 8, 2021, in the Korean Intellectual Property Office, the disclosure of which is incorporated by reference herein in its entirety.

BACKGROUND

1. Field

Embodiments relate to an operation method of a storage controller using a history table, and a storage device including the storage controller.

2. Description of the Related Art

A memory device stores data in response to a write request and outputs data stored therein in response to a read request. The memory device may be classified as a volatile memory device, which loses data stored therein when a power supply is interrupted, such as a dynamic random access memory (DRAM) device, a static RAM (SRAM) device, or a non-volatile memory device, which retains data stored therein even when a power supply is interrupted, such as a flash memory device, a phase-change RAM (PRAM), a magnetic RAM (MRAM), or a resistive RAM (RRAM).

The prior art, US2020/0090763A1, discloses a memory system that obtains a count value through a separate additional read operation being a shift read operation and calculates a shift amount through a logical operation of comparing a count value stored in a history table with the obtained count value. According to the prior art, the additional read operation causes an increase of an input/output (I/O) load, and the logical operation for calculating a change of threshold voltage distributions of memory cells causes an increase of computational burden. Accordingly, there may be required a technique for optimizing a read voltage, without an additional read operation for obtaining information of threshold voltage distributions and a separate logical operation.

SUMMARY

Embodiments are directed to a storage controller that communicates with a non-volatile memory device, and an operation method of the storage controller including performing a first direct memory access (DMA) read operation on data stored in the non-volatile memory device, based on a first read voltage of a history table, obtaining a page count value, based on the first DMA read operation, determining a second read voltage different from the first read voltage based on a difference between the page count value and an idle count value, without an additional read operation for the data stored in the non-volatile memory device, and updating the first read voltage of the history table with the second read voltage.

Embodiments are directed to a storage controller that communicates with a non-volatile memory device, and an operation method of the storage controller including determining whether a first read voltage is registered at a history table, when it is determined that the first read voltage is registered at the history table, performing a first direct memory access (DMA) read operation on data stored in the non-volatile memory device, based on the first read voltage, obtaining a page count value, based on the first DMA read operation, determining a second read voltage different from the first read voltage based on a difference between the page count value and an idle count value, without an additional read operation for the data stored in the non-volatile memory device, and updating the first read voltage of the history table based on the second read voltage.

Embodiments are directed to a storage device including a non-volatile memory device that includes a plurality of memory cells storing data, and a storage controller that communicates with the non-volatile memory device. The storage controller includes a history table that stores information about a first read voltage, a direct memory access (DMA) controller that performs a first DMA read operation on the data based on the first read voltage and generates a page count value corresponding to the first DMA read operation, an error correction code (ECC) engine that determines whether raw data read by the first DMA read operation include an uncorrectable error, and a memory configured to store firmware. The firmware controls the first DMA read operation of the DMA controller, determines a second read voltage, which is a result of optimizing the first read voltage, based on a difference between the page count value and an idle count value, and updates the history table such that the first read voltage is changed to the second read voltage, when the uncorrectable error is absent from the raw data.

BRIEF DESCRIPTION OF THE DRAWINGS

Features will become apparent to those of skill in the art by describing in detail example embodiments with reference to the attached drawings in which.

DETAILED DESCRIPTION

Components described in the detailed description with reference to terms "part", "unit", "module", "layer", etc. and function blocks illustrated in drawings may be implemented in the form of software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
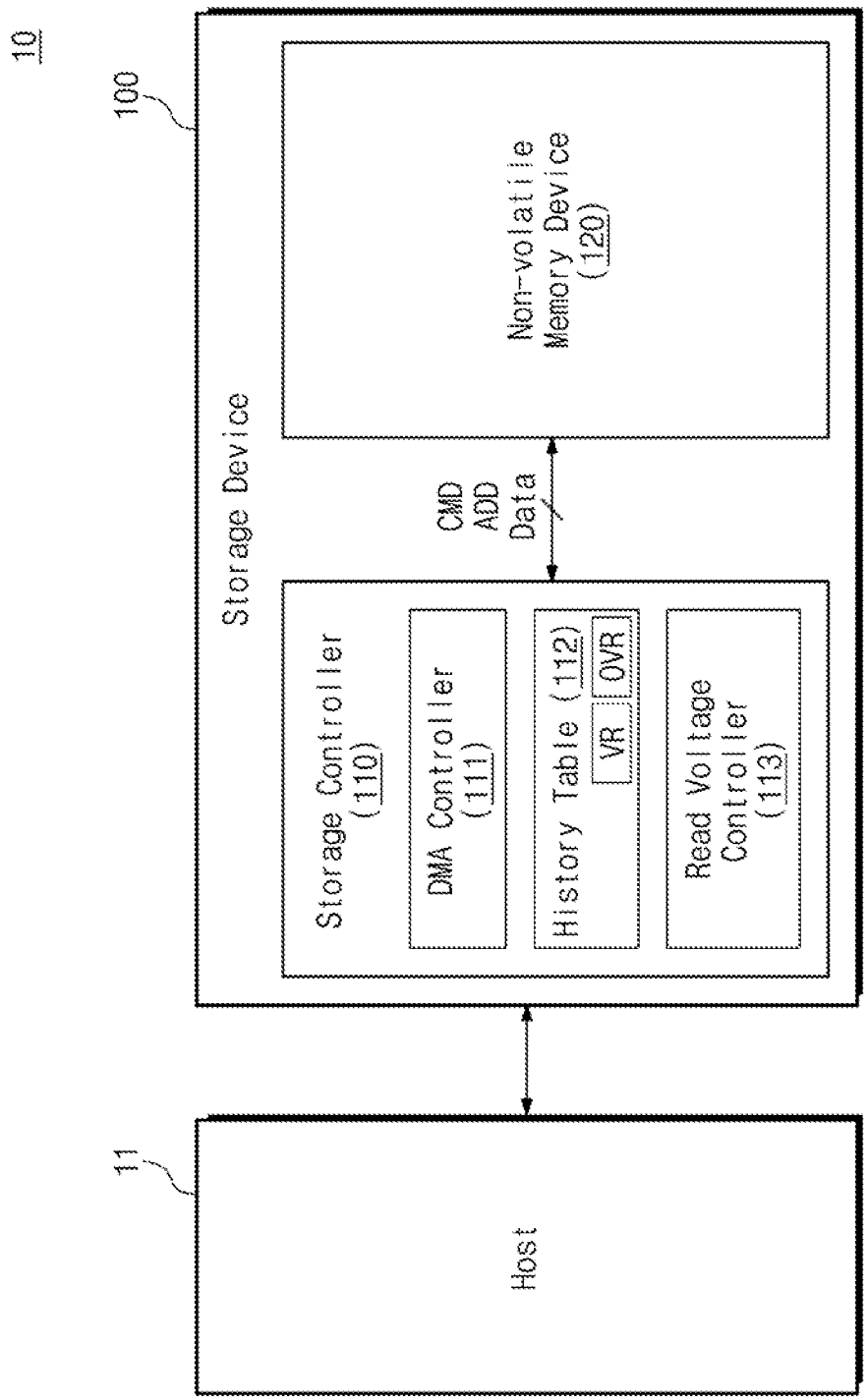
FIG. 1 is a block diagram of a storage system according to an example embodiment.

FIG. 1 is a block diagram of a storage system according to an example embodiment.

Referring to FIG. 1, a storage system 10 may include a host 11 and a storage device 100. In an example embodiment, the storage system 10 may be a computing system, which is configured to process a variety of information, such as a personal computer (PC), a notebook, a laptop, a server, a workstation, a tablet PC, a smartphone, a digital camera, and a black box.

The host 11 may control overall operations of the storage system 10. For example, the host 11 may store data in the storage device 100 or may read data stored in the storage device 100. In another implementation, the host 11 may control the storage device 100 such that the storage device 100 performs a direct memory access (DMA) operation (e.g., a DMA write operation or a DMA read operation) with any other external device (not illustrated).

The storage device 100 may include a storage controller 110 and a non-volatile memory device 120.

The storage controller 110 may store data in the non-volatile memory device 120 or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120 or may read the data stored in the non-volatile memory device 120.

The non-volatile memory device 120 may store data. In an example embodiment, the non-volatile memory device 120 may be a NAND flash memory device or one of various storage devices that retain data stored therein even though a power is turned off, such as a PRAM, an MRAM, a RRAM, and an FRAM.

The storage controller 110 may include a DMA controller 111, a history table 112, and a read voltage controller 113.

The DMA controller 111 may control a DMA operation between the non-volatile memory device 120 and any other external device (not illustrated) depending on a request of the host 11. The DMA controller 111 may process data according to the DMA operation in units of page. The DMA controller 111 may generate a page count value based on a DMA read operation. The page count value may be used to determine an optimized read voltage OVR.

The page count value may be a value that is obtained by counting the number of memory cells having a specific bit value from among memory cells read in units of page. For example, the page count value may indicate the number of memory cells having a first bit value (e.g., bit value "1") from among a plurality of memory cells, each of which has the first bit value or a second bit value (e.g., bit value "0") and which belong to a page corresponding to the DMA read operation.

The non-volatile memory device 120 may include a plurality of memory cells. The plurality of memory cells may form programmed threshold voltage distributions. In a logical page corresponding to the DMA read operation, a threshold voltage distribution corresponding to each of the plurality of memory cells may be classified as the first bit value or the second bit value, based on a read voltage VR and the DMA read operation. The DMA controller 111 may determine the number of memory cells indicating the first bit value from among a plurality of memory cells as a page count value.

In an example embodiment, the DMA controller 111 may generate a page count value from the DMA read operation. For example, the DMA read operation may include determining bit values of memory cells in units of logical page. A page count value may be obtained from the determined bit values. Thus, a page count value may be obtained by the DMA read operation without an additional read operation (e.g., a separate read operation for only read voltage change, not for data acquisition).

The history table 112 may store information about the read voltage VR and the optimized read voltage OVR. The read voltage VR may be a default read voltage at an initial time, which is not optimized. The initial time may be a time when a memory cell of the non-volatile memory device 120 is programmed to have a threshold voltage corresponding to a bit value.

The optimized read voltage OVR may be a read voltage optimized for a changed threshold voltage distribution at a retention time when a considerable time passes from the initial time. The optimized read voltage OVR may be determined based on a page count value generated by the DMA controller 111. In an example embodiment, the optimized read voltage OVR may be updated with another optimized read voltage for the purpose of applying an additionally changed threshold voltage distribution as a time further passes. The read voltage VR and the optimized read voltage OVR will be more fully described with reference to FIG. 7.

The read voltage controller 113 may control a read voltage of the non-volatile memory device 120 with reference to the history table 112. In an example embodiment when it is determined that read retry is called for (e.g., when an uncorrectable error occurs), the storage controller 110 may adjust the read voltage of the non-volatile memory device 120 to the optimized read voltage OVR through the read voltage controller 113 with reference to the history table 112. The read retry may be performed when data obtained by a read operation are unavailable due to an uncorrectable error, and may include adjusting a read voltage and again performing the read operation.

According to the present example embodiment, the storage device 100 may store information about the optimized read voltage OVR based on a page count value of the DMA read operation in the history table 112, and may change a read voltage of the non-volatile memory device 120 with reference to the history table 112. In this case, because the reference for the optimized read voltage OVR of the history table 112 is made without an additional read operation for changing the read voltage of the non-volatile memory device 120, a speed at which the storage device 100 processes data may be improved, and the reliability of the storage device 100 may be improved.

Figure 2:
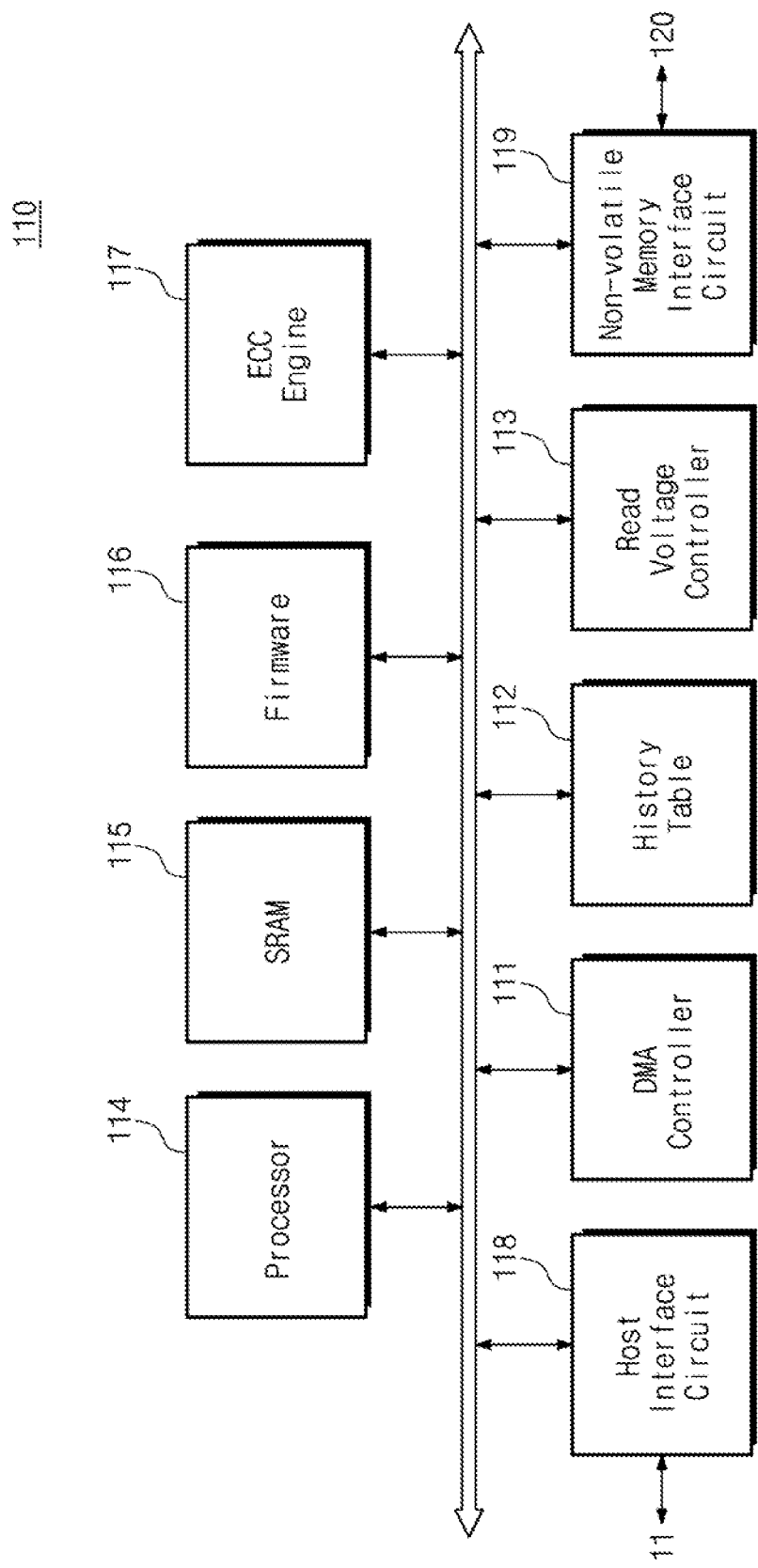
FIG. 2 is a block diagram illustrating a storage controller of FIG. 1 in detail, according to an example embodiment.

FIG. 2 is a block diagram illustrating a storage controller of FIG. 1 in detail, according to an example embodiment.

Referring to FIGS. 1 and 2, the storage controller 110 may communicate with the host 11 and the non-volatile memory device 120. The storage controller 110 may include the DMA controller 111, the history table 112, the read voltage controller 113, a processor 114, an SRAM 115, firmware 116, an ECC engine 117, a host interface circuit 118, and a non-volatile memory interface circuit 119.

The DMA controller 111, the history table 112, the read voltage controller 113, the processor 114, the SRAM 115, the firmware 116, the ECC engine 117, the host interface circuit 118, and the non-volatile memory interface circuit 119 may be interconnected through a bus.

The DMA controller 111, the history table 112, and the read voltage controller 113 are similar to the DMA controller 111, the history table 112, and the read voltage controller 113 of FIG. 1, and thus, additional description will be omitted to avoid redundancy.

The processor 114 may control overall operations of the storage controller 110.

The SRAM 115 may be used as a buffer memory, a cache memory, or a working memory of the storage controller 110.

The firmware 116 may include a variety of information that is used for the storage controller 110 to operate. In an example embodiment, the firmware 116 may determine the optimized read voltage OVR based on a page count value, may manage the history table 112, and may change a read voltage of the non-volatile memory device 120 through the read voltage controller 113. The firmware 116 may be stored in a memory that stores instructions, such as a read only memory (ROM) and/or the non-volatile memory device 120, and may be executed by the processor 114.

The ECC engine 117 may detect and correct an error of data read from the non-volatile memory device 120. In an example embodiment, as the number of program and erase cycles increases or as a time passes after data are stored in the non-volatile memory device 120, an error level (e.g., the number of flipped data bits) of the non-volatile memory device 120 may increase. The ECC engine 117 may have an error correction capacity of a given level. In the case where an error of data read from the non-volatile memory device 120 exceeds an error correction capacity of the ECC engine 117, the error of the data read from the non-volatile memory device 120 may not be corrected. The ECC engine 117 may determine whether data have an uncorrectable error. The firmware 116 may manage an uncorrectable error through the ECC engine 117. To make an error level of data low, the firmware 116 may perform the read retry (operation) through the DMA controller 111 and the read voltage controller 113 with reference to the history table 112.

The host interface circuit 118 may provide an interface for the storage controller 110 to communicate with the host 11. In an example embodiment, the host interface circuit 118 may be implemented based on at least one of various interfaces such as a SATA (Serial ATA) interface, a PCIe (Peripheral Component Interconnect Express) interface, a SAS (Serial Attached SCSI), an NVMe (Nonvolatile Memory express) interface, and an UFS (Universal Flash Storage) interface. In an example embodiment, the storage controller 110 may receive a signal requesting the DMA read operation from the host 11 through the host interface circuit 118.

The non-volatile memory interface circuit 119 may provide an interface for the storage controller 110 to communicate with the non-volatile memory device 120. In an example embodiment, the non-volatile memory interface circuit 119 may be implemented based on a NAND interface.

In an example embodiment under control of the DMA controller 111, the storage controller 110 may perform the DMA read operation on data stored in the non-volatile memory device 120 through the non-volatile memory interface circuit 119. In an example embodiment under control of the read voltage controller 113, the storage controller 110 may adjust a read voltage, which is used for the DMA read operation at the non-volatile memory device 120, through the non-volatile memory interface circuit 119.

Figure 3:
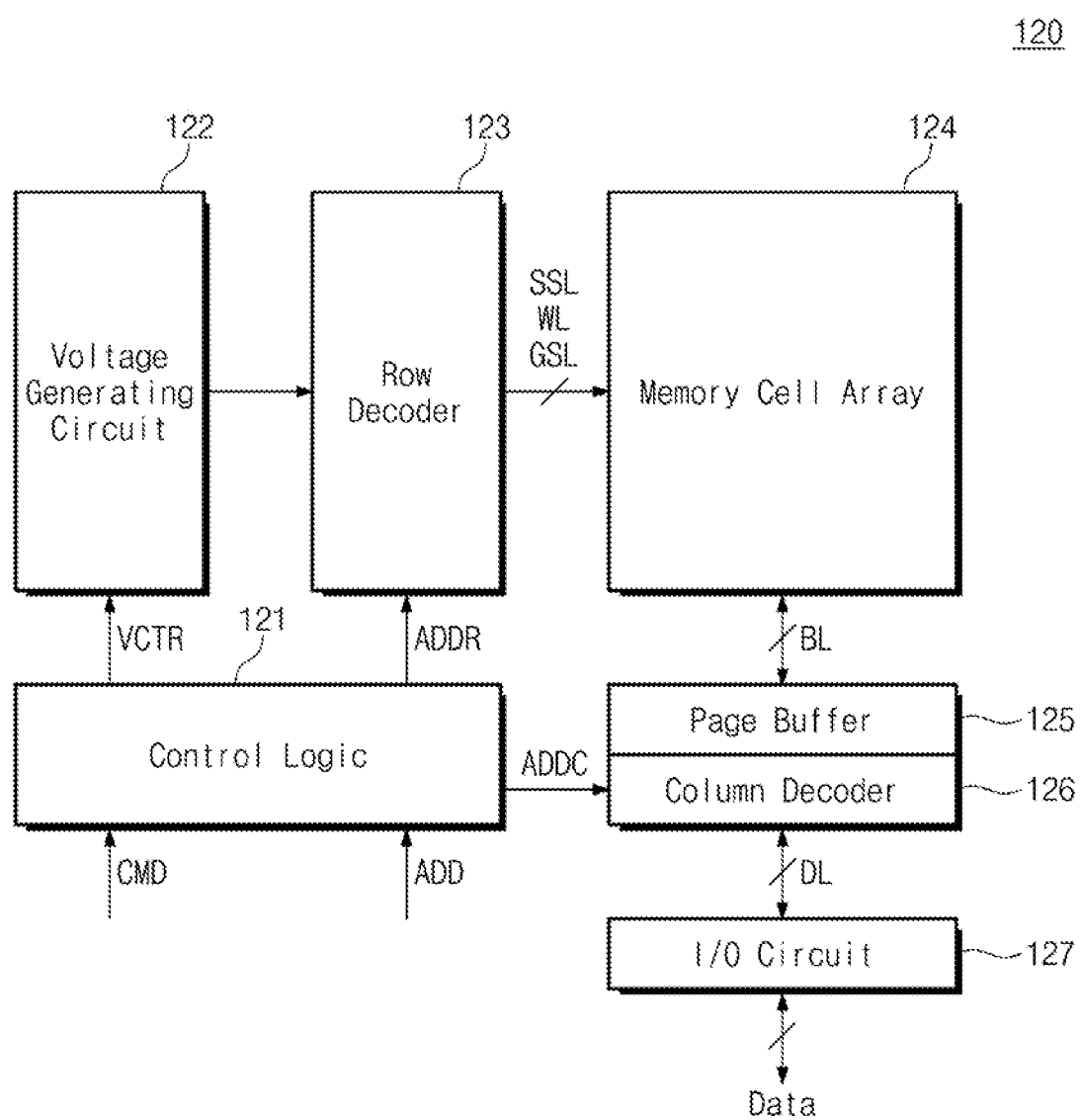
FIG. 3 is a block diagram illustrating a non-volatile memory device of FIG. 1 in detail, according to an example embodiment.
Figure 4:
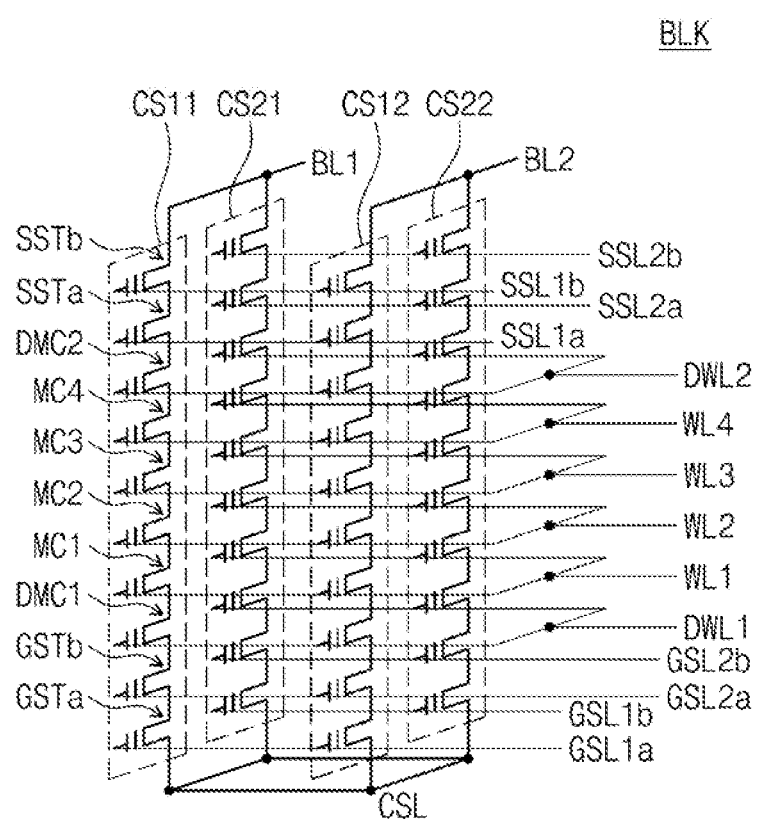
FIG. 4 is a diagram illustrating a memory block included in a memory cell array of FIG. 3, according to an example embodiment.

FIG. 3 is a block diagram illustrating a non-volatile memory device of FIG. 1 in detail, according to an example embodiment. FIG. 4 is a diagram illustrating a memory block included in a memory cell array of FIG. 3, according to an example embodiment.

Referring to FIGS. 1, 3, and 4, the non-volatile memory device 120 may communicate with the storage controller 110. For example, the non-volatile memory device 120 may receive the address ADD and the command CMD from the storage controller 110. The non-volatile memory device 120 may exchange data with the storage controller 110.

The non-volatile memory device 120 may include control logic 121, a voltage generating circuit 122, a row decoder 123, a memory cell array 124, a page buffer 125, a column decoder 126, and an input/output (I/O) circuit 127.

The control logic 121 may receive the command CMD and the address ADD from the storage controller 110. The command CMD may be a signal directing an operation to be performed at the non-volatile memory device 120, such as a read operation, a write operation, or an erase operation. The address ADD may include a row address ADDR and a column address ADDC. The control logic 121 may generate the row address ADDR, the column address ADDC, and a read voltage control signal VCTR, based on the command CMD and the address ADD. The read voltage control signal VCTR may be a signal of controlling a read voltage that is generated by the voltage generating circuit 122.

In an example embodiment, the command CMD may include change request information of a read voltage for read retry. In another implementation, the control logic 121 may receive a signal of requesting a change of a read voltage, separately from the command CMD.

The voltage generating circuit 122 may control a voltage that is applied to the memory cell array 124 through the row decoder 123. In an example embodiment, the voltage generating circuit 122 may change a read voltage to be used in the DMA read operation, based on the read voltage control signal VCTR.

The row decoder 123 may receive the row address ADDR from the control logic 121. The row decoder 123 may be connected with the memory cell array 124 through string selection lines SSL, word lines WL, and ground selection lines GSL. The row decoder 123 may decode the row address ADDR and may control voltages to be applied to the string selection lines SSL, the word lines WL, and the ground selection lines GSL based on a decoding result and a voltage received from the voltage generating circuit 122.

The memory cell array 124 may include a plurality of memory blocks. Each of the plurality of memory blocks may be similar in structure to a memory block BLK illustrated in FIG. 4. The memory block BLK illustrated in FIG. 4 may correspond to a physical erase unit of the non-volatile memory device 120, but the physical erase unit may be changed to a page unit, a word line unit, a sub-block unit, etc.

Referring to FIG. 4, the memory block BLK may include a plurality of cell strings CS11, CS12, CS21, and CS22. The plurality of cell strings CS11, CS12, CS21, and CS22 may be arranged in a row direction and a column direction. For brevity of drawing, 4 cell strings CS11, CS12, CS21, and CS22 are illustrated in FIG. 4, but the number of cell strings may be increased or decreased in a row direction or a column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may be implemented with a charge trap flash (CTF) memory cell. The plurality of cell transistors may be stacked in a height direction that is a direction perpendicular to a plane (e.g., a semiconductor substrate (not illustrated)) defined by the row direction and the column direction.

The plurality of cell transistors may be connected in series between the corresponding bit line (e.g., BL1 or BL2) and a common source line CSL. The plurality of cell transistors may include, e.g., string selection transistors SSTa and SSTb, dummy memory cells DMC1 and DMC2, memory cells MC1 to MC4, and ground selection transistors GSTa and GSTb. The serially-connected string selection transistors SSTa and SSTb may be provided between the serially-connected memory cells MC1 to MC4 and a corresponding bit line (e.g., BL1 and BL2). The serially-connected ground selection transistors GSTa and GSTb may be provided between the serially-connected memory cells MC1 to MC4 and the common source line CSL.

In an example embodiment, the second dummy memory cell DMC2 may be provided between the serially-connected string selection transistors SSTa and SSTb and the serially-connected memory cells MC1 to MC4, and the first dummy memory cell DMC1 may be provided between the serially-connected memory cells MC1 to MC4 and the serially-connected ground selection transistors GSTa and GSTb.

In the plurality of cell strings CS11, CS12, CS21, and CS22, memory cells placed at the same height from among the memory cells MC1 to MC4 may share the same word line. For example, the first memory cells MC1 of the plurality of cell strings CS11, CS12, CS21, and CS22 may be placed at the same height from the substrate (not illustrated) and may share a first word line WL1. The second memory cells MC2 of the plurality of cell strings CS11, CS12, CS21, and CS22 may be placed at the same height from the substrate (not illustrated) and may share a second word line WL2. Likewise, the third memory cells MC3 of the plurality of cell strings CS11, CS12, CS21, and CS22 may be placed at the same height from the substrate (not illustrated) and may share a third word line WL3, and the fourth memory cells MC4 of the plurality of cell strings CS11, CS12, CS21, and CS22 may be placed at the same height from the substrate (not illustrated) and may share a fourth word line WL4.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may share a string selection line SSL1b, and the string selection transistors SSTa of the cell strings CS11 and CS12 may share a string selection line SSL1a. The string selection transistors SSTb of the cell strings CS21 and CS22 may share a string selection line SSL2b, and the string selection transistors SSTa of the cell strings CS21 and CS22 may share a string selection line SSL2a.

Ground selection transistors placed at the same height and the same row from among the ground selection transistors GSTa and GSTb of the plurality of cell strings CS11, CS12, CS21, and CS22 may share the same ground selection line. For example, the ground selection transistors GSTb of the cell strings CS11 and CS12 may be connected with a ground selection line GSL1b, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL2a.

The memory block BLK illustrated in FIG. 4 is an example that may be changed, e.g., the number of cell strings may be increased or decreased, and the number of rows of cell strings and the number of columns of cell strings may be increased or decreased depending on the number of cell strings. Also, in the memory block BLK, the number of cell transistors may be increased or decreased, the height of the memory block BLK may be increased or decreased depending on the number of cell transistors, and the number of lines connected with the cell transistors may be increased or decreased depending on the number of cell transistors.

In an example embodiment, the memory block BLK may include a plurality of memory pages. For example, the first memory cells MC1 of the cell strings CS11, CS12, CS21, and CS22 connected with the first word line WL1 may be referred to as a "first physical page". In an example embodiment, one physical page may correspond to a plurality of logical pages. For example, in the case where a memory cell is a triple level cell (TLC) storing information corresponding to 3 bits, a physical page may correspond to 3 logical pages. A multi-level cell storing two or more bits will be described in more detail with reference to FIGS. 5A, 5B, and 5C.

Referring again to FIGS. 1 and 3, the page buffer 125 may be connected with the memory cell array 124 through bit lines BL. The page buffer 125 may read data from the memory cell array 124 in units of page, by sensing voltages of the bit lines BL.

The column decoder 126 may receive the column address ADDC from the control logic 121. The column decoder 126 may decode the column address ADDC and may provide the data read by the page buffer 125 to the I/O circuit 127 based on a decoding result.

The column decoder 126 may receive data from the I/O circuit 127 through data lines DL. The column decoder 126 may receive the column address ADDC from the control logic 121. The column decoder 126 may decode the column address ADDC and may provide the data read from the I/O circuit 127 to the page buffer 125 based on a decoding result. The page buffer 125 may store the data provided from the I/O circuit 127 in the memory cell array 124 through the bit lines BL in units of page.

The I/O circuit 127 may be connected with the column decoder 126 through the data lines DL. The I/O circuit 127 may provide data received from the storage controller 110 to the column decoder 126 through the data lines DL. The I/O circuit 127 may output data received through the data lines DL to the storage controller 110.

In an example embodiment, the address ADD, the command CMD, and the data described with reference to FIG. 3 may be transmitted/received through the non-volatile memory interface circuit 119 of the storage controller 110 of FIG. 2.

Figure 5A:
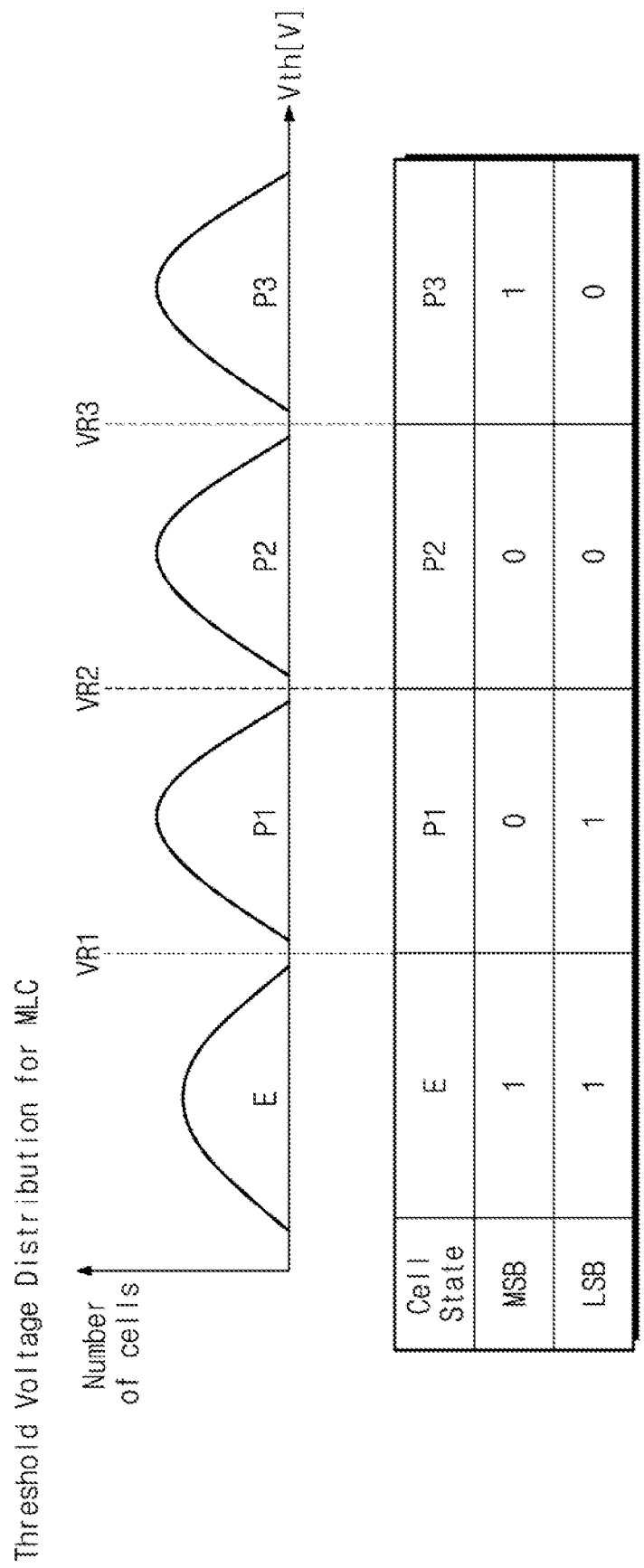
FIG. 5A is a diagram illustrating threshold voltage distributions for multi-level cells, according to an example embodiment.

FIG. 5A is a diagram illustrating threshold voltage distributions for multi-level cells, according to an example embodiment.

A graph of threshold voltage distributions of multi-level cells MLC storing 2 bits and a bit table for each page corresponding to the threshold voltage distributions are illustrated in FIG. 5A. In the graph of the multi-level cell MLC, a horizontal axis represents a threshold voltage (e.g., a level of a threshold voltage), and a vertical axis represents the number of memory cells.

Below, for convenience of description, the multi-level cell MLC referred to a memory cell storing 2 bits, a memory cell storing 3 bits is referred to as a "triple level cell TLC", and a memory cell storing 4 bits is referred to as a "quadruple level cell QLC".

The multi-level cell MLC may have one of an erase state "E", a first programming state P1, a second programming state P2, and a third programming state P3. In the first through programming states P1~P3, threshold voltage distributions sequentially increase.

In the multi-level cell MLC, a first read voltage VR1 may be a voltage for distinguishing the erase state "E" from the first programming state P1. A second read voltage VR2 may be a voltage for distinguishing the first programming state P1 from the second programming state P2. A third read voltage VR3 may be a voltage for distinguishing the second programming state P2 from the third programming state P3.

Referring to the table in FIG. 5A of the multi-level cell MLC, a most significant bit MSB and a least significant bit LSB according to a cell state are illustrated. A physical page corresponding to the multi-level cell MLC storing 2 bits may correspond to a first logical page and a second logical page. In the multi-level cell MLC, the first logical page may indicate the most significant bit MSB, and the second logical page may indicate the least significant bit LSB.

In an example embodiment, a read voltage for the multi-level cell MLC may correspond to one of a plurality of logical pages. For example, in the multi-level cell MLC, a read operation corresponding to the first logical page may be performed based on the first read voltage VR1 and the third read voltage VR3. A read operation corresponding to the second logical page may be performed based on the second read voltage VR2.

Figure 5B:
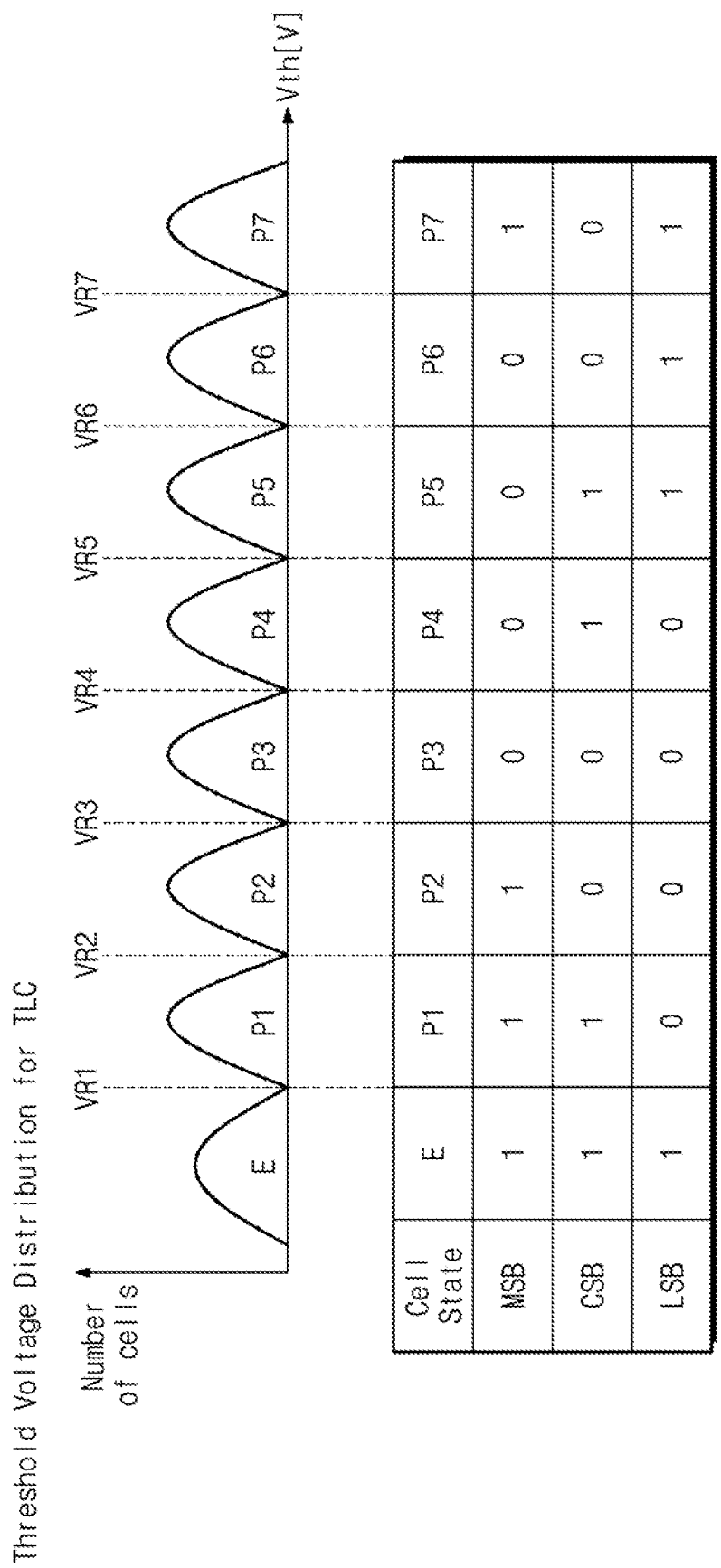
FIG. 5B is a diagram illustrating threshold voltage distributions for triple level cells, according to an example embodiment.

FIG. 5B is a diagram illustrating threshold voltage distributions for triple level cells, according to an example embodiment.

A graph of threshold voltage distributions of the triple level cells TLC storing 3 bits and a bit table for each page corresponding to the threshold voltage distributions are illustrated in FIG. 5B. In the graph of the triple level cell TLC, a horizontal axis represents a threshold voltage (e.g., a level of a threshold voltage), and a vertical axis represents the number of memory cells.

The triple level cell TLC may have one of an erase state "E", a first programming state P1, a second programming state P2, a third programming state P3, a fourth programming state P4, a fifth programming state P5, a sixth programming state P6, and a seventh programming state P7. In the first to seventh programming states P1~P7, threshold voltage distributions sequentially increase.

In the triple level cell TLC, a first read voltage VR1 may be a voltage for distinguishing the erase state "E" from the first programming state P1. Likewise, each of second to seventh read voltages VR2 to VR7 may be a voltage for distinguishing each of the second to seventh programming states P2 to P7 from a previous state (i.e., an immediately previous state having a low threshold voltage distribution).

Referring to the table in FIG. 5B of the triple level cell TLC, a most significant bit MSB, a center significant bit CSB, and a least significant bit LSB according to a cell state are illustrated. A physical page corresponding to the triple level cell TLC storing 3 bits may correspond to a first logical page, a second logical page, and a third logical page. In the triple level cell TLC, the first logical page may indicate the most significant bit MSB, the second logical page may indicate the center significant bit CSB, and the third logical page may indicate the least significant bit LSB.

In an example embodiment, a read voltage for the triple level cell TLC may correspond to one of a plurality of logical pages. For example, in the triple level cell TLC, a read operation corresponding to the first logical page may be performed based on the first read voltage VR3 and the seventh read voltage VR7. A read operation corresponding to the second logical page may be performed based on the second read voltage VR2, the fourth read voltage VR4, and the sixth read voltage VR6. A read operation corresponding to the third logical page may be performed based on the first read voltage VR1 and the fifth read voltage VR5.

Figure 5C:
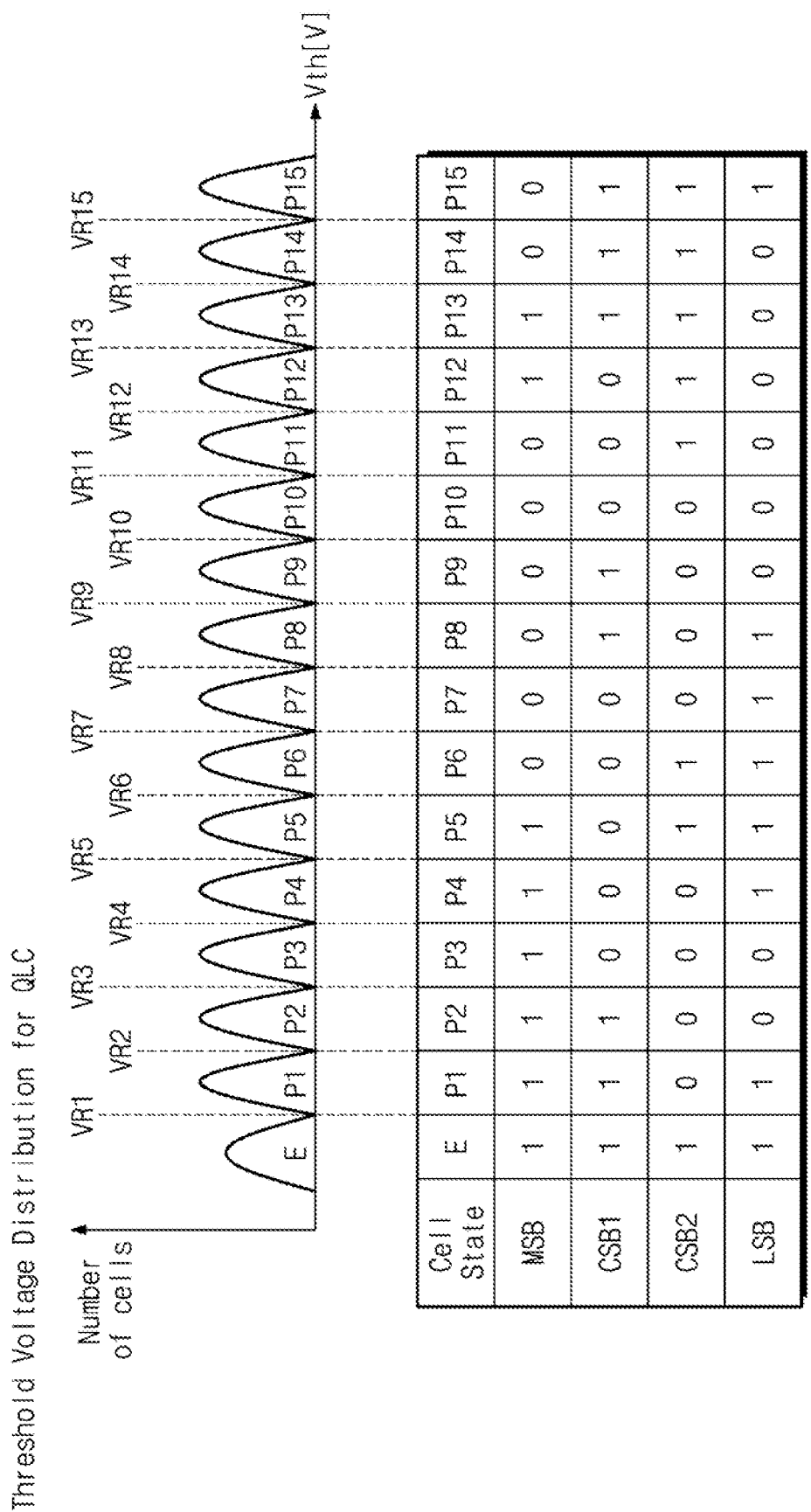
FIG. 5C is a diagram illustrating threshold voltage distributions for quadruple level cells, according to an example embodiment.

FIG. 5C is a diagram illustrating threshold voltage distributions for quadruple level cells, according to an example embodiment.

A graph of threshold voltage distributions of the quadruple level cells QLC storing 4 bits and a bit table for each page corresponding to the threshold voltage distributions are illustrated in FIG. 5C. In the graph of the quadruple level cell QLC, a horizontal axis represents a threshold voltage (e.g., a level of a threshold voltage), and a vertical axis represents the number of memory cells.

The quadruple level cell QLC may have one of an erase state "E", a first programming state P1, a second programming state P2, a third programming state P3, a fourth programming state P4, a fifth programming state P5, a sixth programming state P6, a seventh programming state P7, an eighth programming state P8, a ninth programming state P9, a tenth programming state P10, an eleventh programming state P11, a twelfth programming state P12, a thirteenth programming state P13, a fourteenth programming state P14, and a fifteenth programming state P15. In the first to fifteenth programming states P1~P15, threshold voltage distributions sequentially increase.

In the quadruple level cell QLC, a first read voltage VR1 may be a voltage for distinguishing the erase state "E" from the first programming state P1. Likewise, each of second to fifteenth read voltages VR2 to VR15 may be a voltage for distinguishing each of the second to fifteenth programming states P2 to P15 from a previous state (i.e., an immediately previous state having a low threshold voltage distribution).

Referring to the table in FIG. 5C of the quadruple level cell QLC, a most significant bit MSB, a first center significant bit CSB1, a second center significant bit CSB2, and a least significant bit LSB according to a cell state are illustrated. A physical page corresponding to the quadruple level cell QLC storing 4 bits may correspond to a first logical page, a second logical page, a third logical page, and a fourth logical page. In the quadruple level cell QLC, the first logical page may indicate the most significant bit MSB, the second logical page may indicate the first center significant bit CSB1, the third logical page may indicate the second center significant bit CSB2, and the fourth logical page may indicate the least significant bit LSB.

In an example embodiment, a read voltage for the quadruple level cell QLC may correspond to one of a plurality of logical pages. For example, in the quadruple level cell QLC, a read operation corresponding to the first logical page may be performed based on the sixth read voltage VR6, the twelfth read voltage VR12, and the fourteenth read voltage VR14. A read operation corresponding to the second logical page may be performed based on the third read voltage VR3, the eighth read voltage VR8, the tenth read voltage VR10, and the thirteenth read voltage VR13. A read operation corresponding to the third logical page may be performed based on the first read voltage VR1, the fifth read voltage VR5, the seventh read voltage VR7, and the eleventh read voltage VR11. A read operation corresponding to the fourth logical page may be performed based on the second read voltage VR2, the fourth read voltage VR4, the ninth read voltage VR9, and the fifteenth read voltage VR15.

States and read voltages of the multi-level cell MLC, the triple level cell TLC, and the quadruple level cell QLC are described with reference to FIGS. 5A, 5B, and 5C, but the read voltages corresponding to logical pages may be variously changed or modified and one memory cell may store 5 or more bits.

Figure 6:
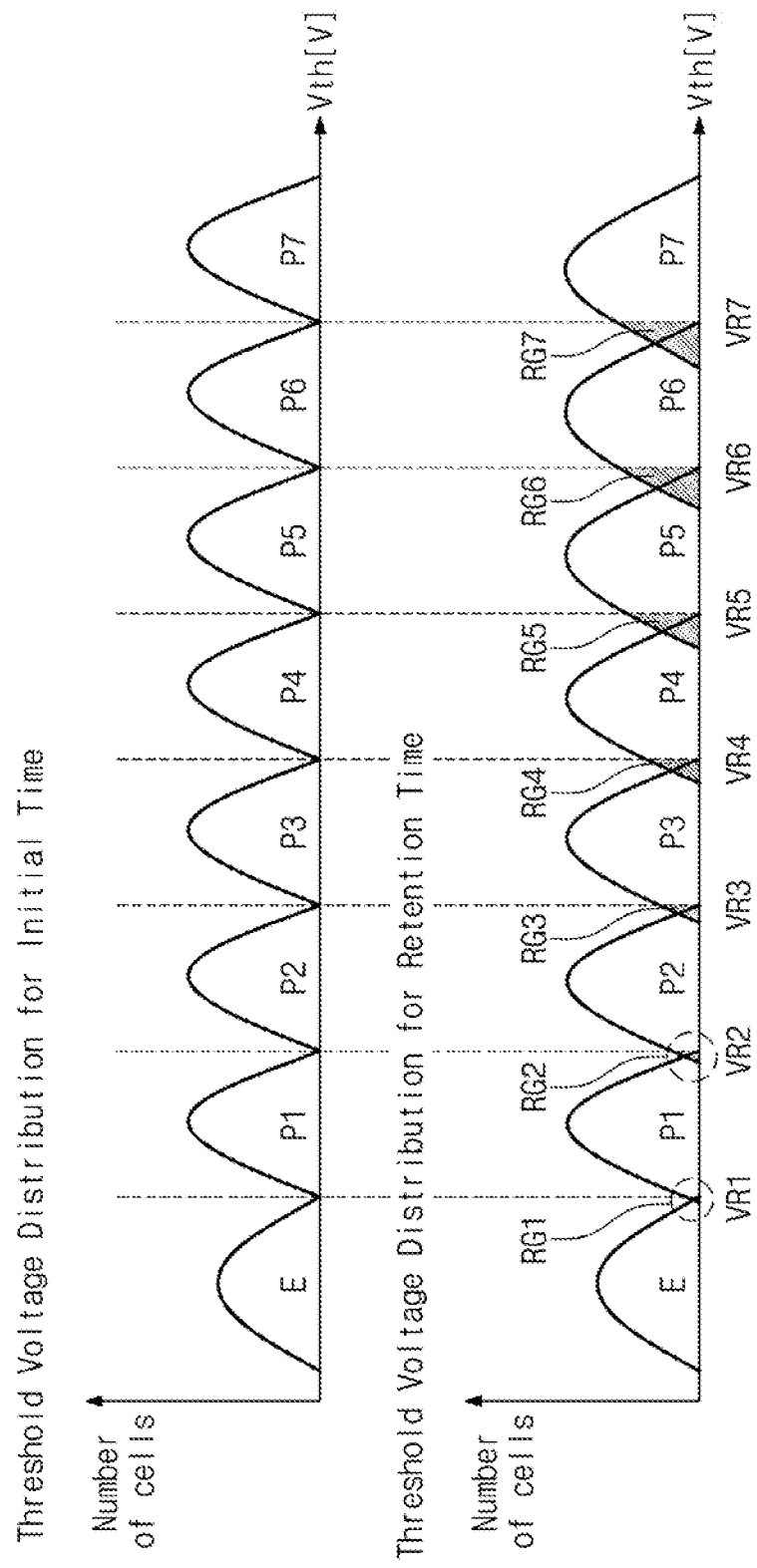
FIG. 6 is a diagram illustrating threshold voltage distributions of an initial time and a retention time, according to an example embodiment.

FIG. 6 is a diagram illustrating threshold voltage distributions of an initial time and a retention time, according to an example embodiment.

Referring to FIG. 6, a graph of threshold voltage distributions of an initial time and a graph of threshold voltage distributions of a retention time are illustrated. In the graphs of FIG. 6, a horizontal axis represents a threshold voltage, and a vertical axis represents the number of memory cells.

The initial time may mean a time point at which a bit is programmed at a memory cell through a write operation or a time within a given short time period from the time point at which the bit is programmed.

The retention time may mean a time point at which a considerable time passes from the time point at which the bit is programmed at the memory cell through the write operation. The retention time is not limited to a specific time point.

As a time passing from the programmed time point increases, the degree by which a threshold voltage distribution is changed may increase. For convenience of description, there are illustrated threshold voltage distributions of the initial time and the retention time, which are associated with the triple level cell TLC, as an example.

Referring to the graph in FIG. 6 illustrating the threshold voltage distributions of the initial time, a memory cell being the triple level cell TLC may have one of the erase state "E" and the first to seventh programming states P1 to P7. At the initial time, the erase state "E" and the first to seventh programming states P1 to P7 may be distinguished from each other by the first to seventh read voltages VR1 to VR7.

Referring to the graph in FIG. 6 illustrating the threshold voltage distributions of the retention time, a threshold voltage distribution of memory cells being the triple level cell TLC may be lower than the corresponding threshold voltage distribution of the initial time. For example, memory cells corresponding to a first region RG1 from among memory cells programmed to the first programming state P1 at the initial time may have a threshold voltage of the erase state "E". Likewise, memory cells corresponding to each of second to seventh regions RG2 to RG7 from among memory cells programmed to each of the second to seventh programming states P2 to P7 at the initial time may have a threshold voltage of a previous state (i.e., an immediately previous state having a low threshold voltage distribution).

As a considerable time passes from a time when memory cells are programmed, threshold voltages of the memory cells may decrease due to a leakage current. Variations of threshold voltage distributions may cause the reduction of reliability of data stored in a non-volatile memory device. As the variation of the threshold voltage distribution becomes greater, an uncorrectable error may occur more frequently. To address this, a read voltage may be changed to an optimized read voltage, or a read retry operation may be employed, in which a read operation is again performed based on the optimized read voltage.

In an example embodiment, the degree by which a threshold voltage distribution is decreased may increase as a threshold voltage becomes greater. For example, the degree by which a threshold voltage distribution of the seventh programming state P7 becomes lower than the seventh read voltage VR7 may correspond to the seventh region RG7. The degree by which a threshold voltage distribution of the sixth programming state P6 becomes lower than the sixth read voltage VR6 may correspond to the sixth region RG6. The seventh region RG7 may be wider than the sixth region RG6. Likewise, the second to sixth regions RG2 to RG6 may be wider than the first to fifth regions RG1 to RG5.

A general storage controller may adjust the highest read voltage (e.g., having the highest voltage level) of a plurality of read voltages for identifying bit values of one logical page. The general storage controller may count the number of memory cells having the first bit value from among memory cells each having the first bit value or the second bit value, in units of logical page. The general storage controller may adjust a read voltage based on the counted value. However, because the counted value is determined based on all read voltages corresponding to one logical page, it may be difficult to simultaneously adjust all the read voltages based on the counted value. As such, there may be considered a way to selectively adjust only a read voltage having the greatest influence on the reduction of reliability from among a plurality of read voltages corresponding to one logical page.

In detail, the degree by which a voltage level of a threshold voltage distribution for identifying a logical page is decreased may increase as a threshold voltage becomes greater. Thus, it may be more suitable to adjust a read voltage for determining a programming state corresponding to a high threshold voltage than to adjust a read voltage for determining a programming state corresponding to a low threshold value. Accordingly, the storage controller 110 may adjust the highest read voltage of a plurality of read voltages corresponding to one logical page.

For example, referring to FIG. 5A, in the case of performing the read retry on the multi-level cell MLC storing 2 bits, the storage controller 110 may adjust the third read voltage VR3 of the first and third read voltages VR1 and VR3 corresponding to the first logical page indicating the most significant bit MSB. The storage controller 110 may adjust the second read voltage VR2 corresponding to the second logical page indicating the least significant bit LSB.

As another example, referring to FIG. 5B, in the case of performing read retry on the triple level cell TLC storing 3 bits, the storage controller 110 may adjust the seventh read voltage VR7 of the third and seventh read voltages VR3 and VR7 corresponding to the first logical page indicating the most significant bit MSB. The storage controller 110 may adjust the sixth read voltage VR6 of the second, fourth, and sixth read voltages VR2, VR4, and VR6 corresponding to the second logical page indicating the center significant bit CSB. The storage controller 110 may adjust the fifth read voltage VR5 of the first and fifth read voltages VR1 and VR5 corresponding to the third logical page indicating the least significant bit LSB.

As another example, referring to FIG. 5C, in the case of performing read retry on the quadruple level cell QLC storing 4 bits, the storage controller 110 may adjust the fourteenth read voltage VR14 of the sixth, twelfth, and fourteenth read voltages VR6, VR12, and VR14 corresponding to the first logical page indicating the most significant bit MSB. The storage controller 110 may adjust the thirteenth read voltage VR13 of the third, eighth, tenth, and thirteenth read voltages VR3, VR8, VR10, and VR13 corresponding to the second logical page indicating the first center significant bit CSB1. The storage controller 110 may adjust the eleventh read voltage VR11 of the first, fifth, seventh, and eleventh read voltages VR1, VR5, VR7, and VR11 corresponding to the third logical page indicating the second center significant bit CSB2. The storage controller 110 may adjust the fifteenth read voltage VR15 of the second, fourth, ninth, and fifteenth read voltages VR2, VR4, VR9, and VR15 corresponding to the fourth logical page indicating the least significant bit LSB.

Figure 7:
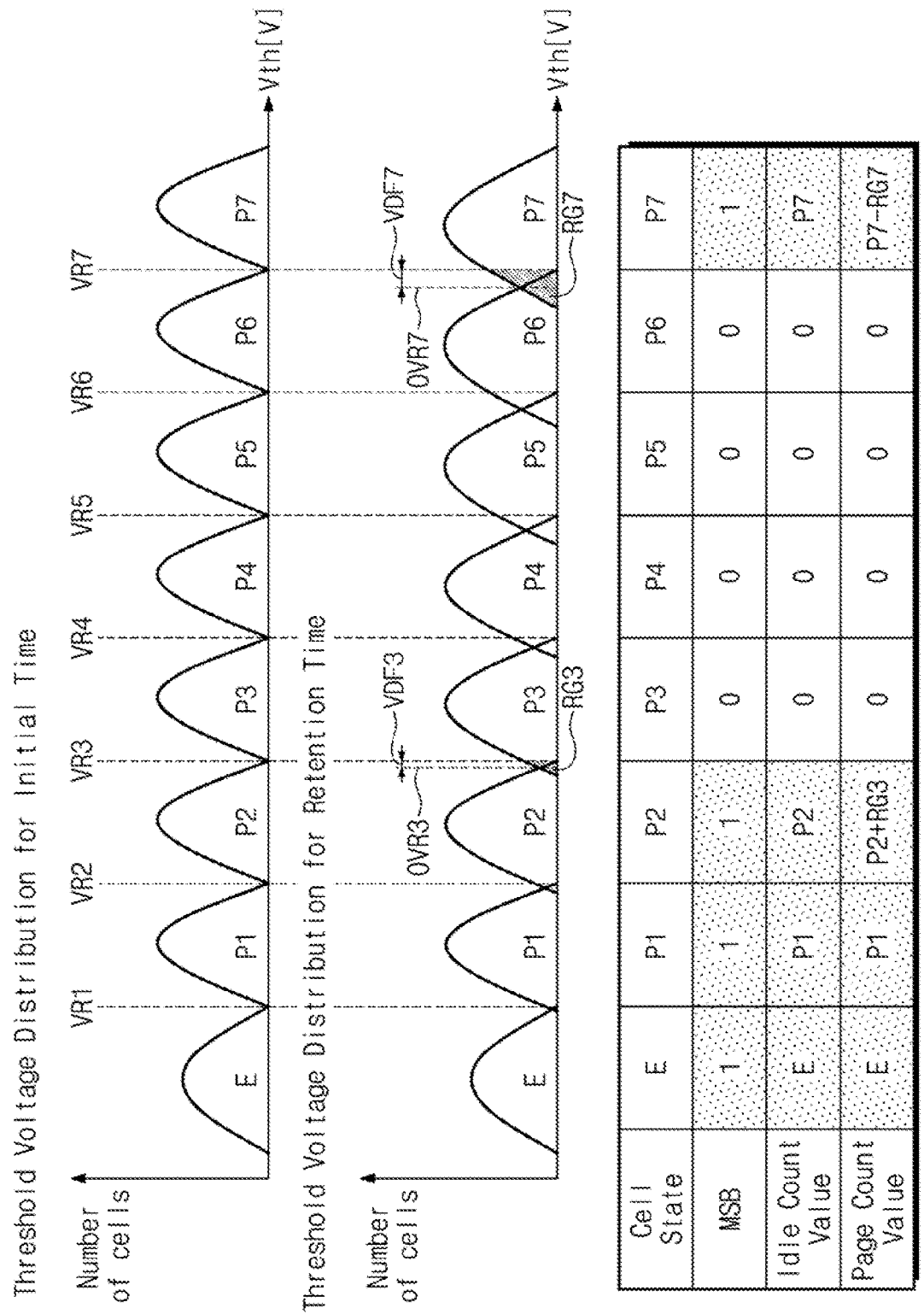
FIG. 7 is a diagram for describing a page count value according to an example embodiment.

FIG. 7 is a diagram for describing a page count value according to an example embodiment.

A page count value corresponding to the first logical page of the triple level cell TLC, which indicates the most significant bit MSB, will be described with reference to FIG. 7. The first logical page of the triple level cell TLC, which indicates the most significant bit MSB, will be described for better understanding.

For better understanding of the page count value, a graph of threshold voltage distributions of an initial time and a graph of threshold voltage distributions of a retention time are illustrated. In the graphs of FIG. 7, a horizontal axis represents a threshold voltage, and a vertical axis represents the number of memory cells.

Referring to the graphs in FIG. 7, memory cells corresponding to the third region RG3 may be programmed to have the third programming state P3 at the initial time, but may have threshold voltages lower than the third read voltage VR3 at the retention time. In the case of changing the third read voltage VR3 to a third optimized read voltage OVR3 at the retention time, an error level of data read from the memory cells may decrease. The third optimized read voltage OVR3 may be a voltage being a criterion for halving the memory cells of the third region RG3 to memory cells of the second programming state P2 from memory cells of the third programming state P3 at the retention time. The third optimized read voltage OVR3 may be lower than the third read voltage VR3 as much as a third voltage difference VDF3.

An error due to the memory cells of the second programming state P2, which have threshold voltages higher than the third optimized read voltage OVR3, and an error due to the memory cells of the third programming state P3, which have threshold voltages lower than the third optimized read voltage OVR3, may be repaired by error correction of the ECC engine 117.

Likewise, memory cells corresponding to the seventh region RG7 may be programmed to have the seventh programming state P7 at the initial time, but may have threshold voltages lower than the seventh read voltage VR7 at the retention time. In the case of changing the seventh read voltage VR7 to a seventh optimized read voltage OVR7 at the retention time, an error level of data read from the memory cells may decrease. The seventh optimized read voltage OVR7 may be a voltage being a criterion for halving the memory cells of the seventh region RG7 to memory cells of the sixth programming state P6 from memory cells of the seventh programming state P7 at the retention time. The seventh optimized read voltage OVR7 may be lower than the seventh read voltage VR7 as much as a seventh voltage difference VDF7.

An error due to the memory cells of the sixth programming state P6, which have threshold voltages higher than the seventh optimized read voltage OVR7, and an error due to the memory cells of the seventh programming state P7, which have threshold voltages lower than the seventh optimized read voltage OVR7, may be repaired by error correction of the ECC engine 117.

A cell state, the most significant bit MSB, an idle count value, and a page count value associated with the triple level cell TLC will be described with reference to the table of FIG. 7.

In the first logical page indicating the most significant bit MSB of the triple level cell TLC, at the initial time, the erase state "E" and the first, second, and seventh programming states P1, P2, and P7 may have the first bit value (e.g., bit value "1"). In the first logical page indicating the most significant bit MSB of the triple level cell TLC, at the initial time, the third, fourth, fifth, and sixth programming states P3, P4, P5, and P6 may have the second bit value (e.g., bit value "0").

The storage controller 110 may count the number of memory cells having the first bit value at the initial time to determine the idle count value. The idle count value may be a value that is obtained by counting the number of memory cells in a specific logical page, which have a specific bit value (e.g., bit value "1" or bit "0") at the initial time. For example, each of a plurality of memory cells may have the first bit value or the second bit value at a logical page corresponding to a read voltage, and the idle count value may indicate the number of memory cells in a logical page, which have the first bit value at the initial time.

The idle count value may be variable every logical page, and a logical page may correspond to at least one read voltage. For example, the first logical page indicating the most significant bit MSB of the triple level cell TLC may correspond to the third read voltage VR3 and the seventh read voltage VR7.

In this case, the idle count value may indicate the number of memory cells having the first bit value, which is counted based on the third and seventh read voltages VR3 and VR7 at the initial time. For example, the idle count value may be a sum of the number of memory cells having the erase state "E", the number of memory cells having the first programming state P1, the number of memory cells having the second programming state P2, and the number of memory cells having the seventh programming state P7.

The storage controller 110 may count the number of memory cells having the first bit value at the retention time to determine the page count value. Like the idle count value, the page count value may be variable every logical page, and a logical page may correspond to at least one read voltage.

For example, in the case of the first logical page indicating the most significant bit MSB of the triple level cell TLC, the page count value may indicate the number of memory cells having the first bit value, which is counted based on the third and seventh read voltages VR3 and VR7 at the retention time. For example, the page count value may be a sum of a first value and a second value: the first value obtained by adding the number of memory cells having the erase state "E", the number of memory cells having the first programming state P1, the number of memory cells having the second programming state P2, and the number of memory cells corresponding to the third region RG3, and the second value obtained by subtracting the number of memory cells corresponding to the seventh region RG7 from the number of memory cells having the seventh programming state P7.

In an example embodiment, at the retention time, the page count value that is based on a read voltage before optimization may have a correlation with the optimized read voltage. The storage controller 110 may optimize a read voltage based on a difference between the idle count value and the page count value.

For example, at a test level, the storage controller 110 may experimentally obtain an optimized read voltage corresponding to the difference between the idle count value and the page count value. At a usage level, the storage controller 110 may change a read voltage to an optimized read voltage obtained in advance, based on the difference between the idle count value and the page count value. In the case where a plurality of read voltages are associated with one logical page, it may be difficult to optimize all the read voltages associated with the logical page, and the storage controller 110 may attempt only optimization of the highest read voltage.

The difference between the idle count value and the page count value may correspond to a value obtained by subtracting the number of memory cells of the third region RG3 from the number of memory cells of the seventh region RG7. The storage controller 110 may store the difference between the idle count value and the page count value so as to correspond to the seventh voltage difference VDF7. When the difference between the idle count value and the page count value at the retention time corresponds to a value obtained by subtracting the number of memory cells of the third region RG3 from the number of memory cells of the seventh region RG7, the storage controller 110 may determine the seventh optimized read voltage OVR7 by decreasing the seventh read voltage VR7 as much as the seventh voltage difference VDF7. In this case, the third read voltage VR3 may not be optimized.

In an example embodiment, the retention time may correspond to a time point at which the storage controller 110 reads raw data from a non-volatile memory device through the DMA read operation. For example, the storage controller 110 may generate a value obtained by counting the number of memory cells having the first bit value as information accompanied every DMA read operation, may determine an optimized read voltage based on the page count value, and may store the optimized read voltage in the history table 112. When an uncorrectable error is detected, the storage controller 110 may perform the read retry with reference to the optimized read voltage of the history table 112, without an additional read operation.

Figure 8:
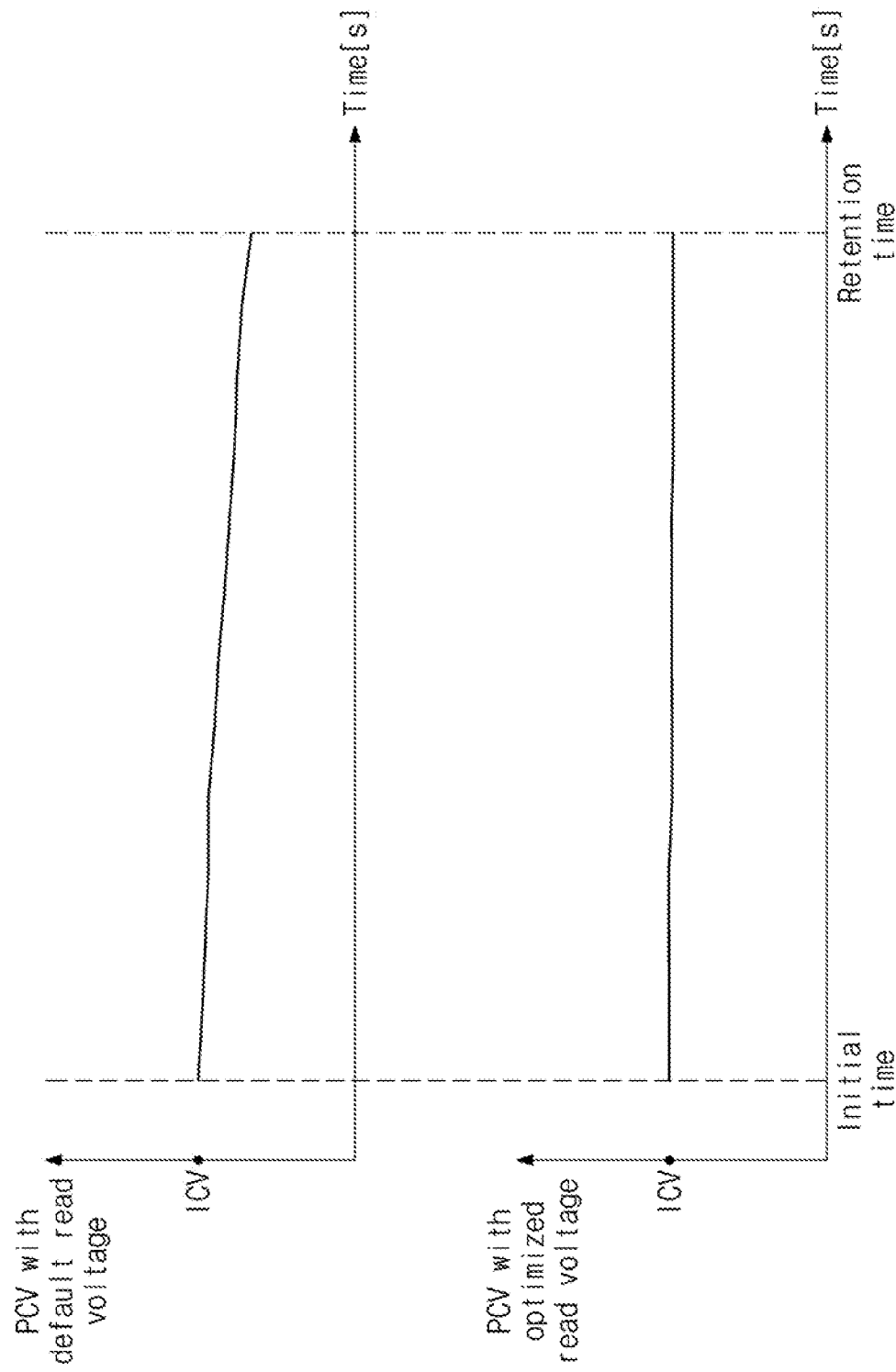
FIG. 8 is a diagram illustrating graphs describing page count values according to an example embodiment.

FIG. 8 is a diagram illustrating graphs describing page count values according to an example embodiment.

Referring to FIG. 8, a page count value PCV according to a default read voltage and the page count value PCV according to an optimized read voltage are illustrated. In FIG. 8, a horizontal axis represents a time, and a vertical axis represents the page count value PCV.

Referring to the graph in FIG. 8 of the page count value PCV according to the default read voltage, the page count value PCV at the initial time may be similar to an idle count value ICV. The page count value PCV at the retention time may be smaller than the idle count value ICV.

Referring to the graph in FIG. 8 of the page count value PCV according to the optimized read voltage, the page count value PCV at the initial time may be similar to the idle count value ICV. The page count value PCV at the retention time may be similar to the idle count value ICV. In this case, the optimized read voltage may mean an optimized read voltage at each of all time points between the initial time and the retention time.

According to the present example embodiment, when a read voltage is optimized, the page count value PCV by the read operation may be similar to the idle count value ICV regardless of the retention time. Thus, to optimize a read voltage may mean to adjust the read voltage such that a difference between the page count value PCV and the idle count value ICV is minimized. However, even though the page count value PCV and the idle count value ICV are similar to each other, errors between read voltages not optimized may be canceled out. This will be described in further detail with reference to FIGS. 9A and 9B.

Figure 9A:
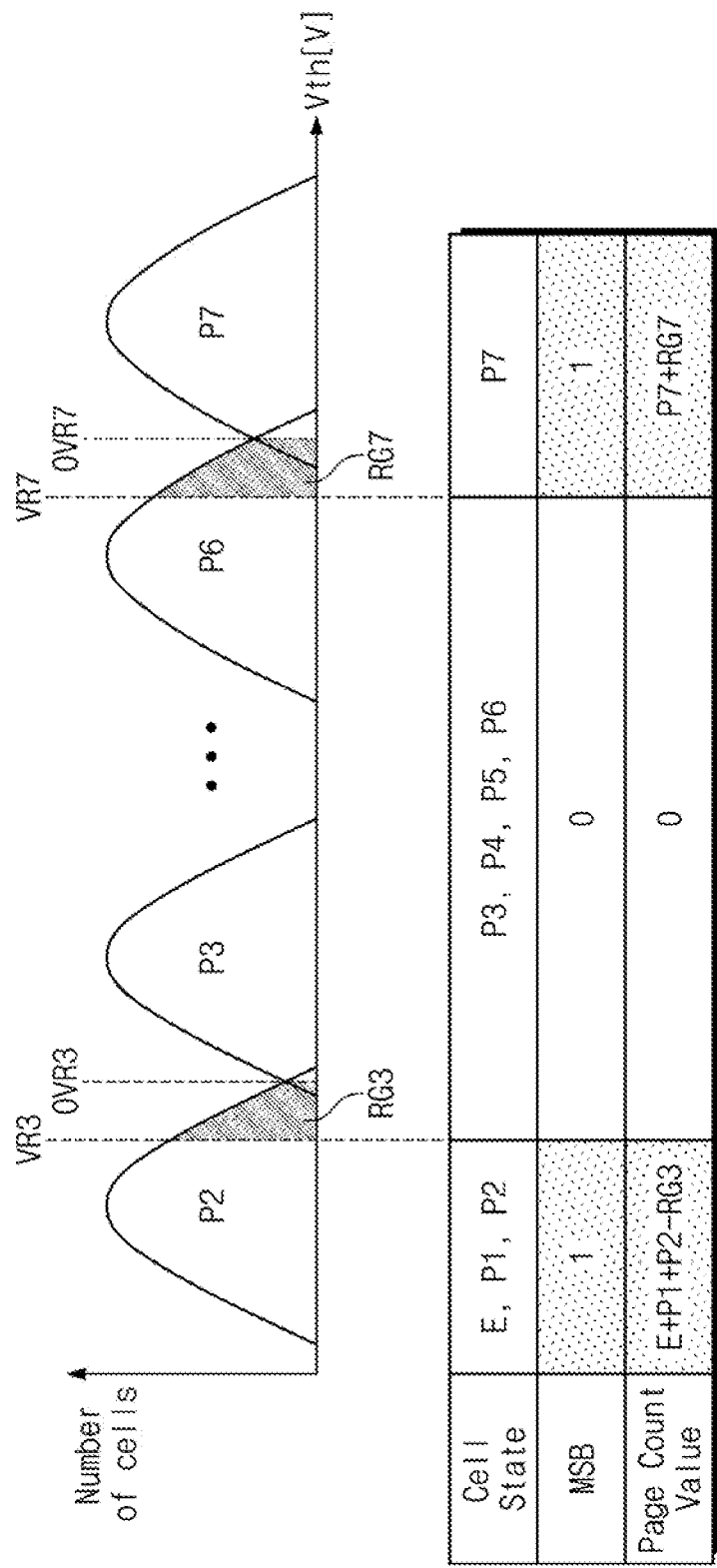
FIGS. 9A and 9B are diagrams describing page count values according to an example embodiment.
Figure 9B:
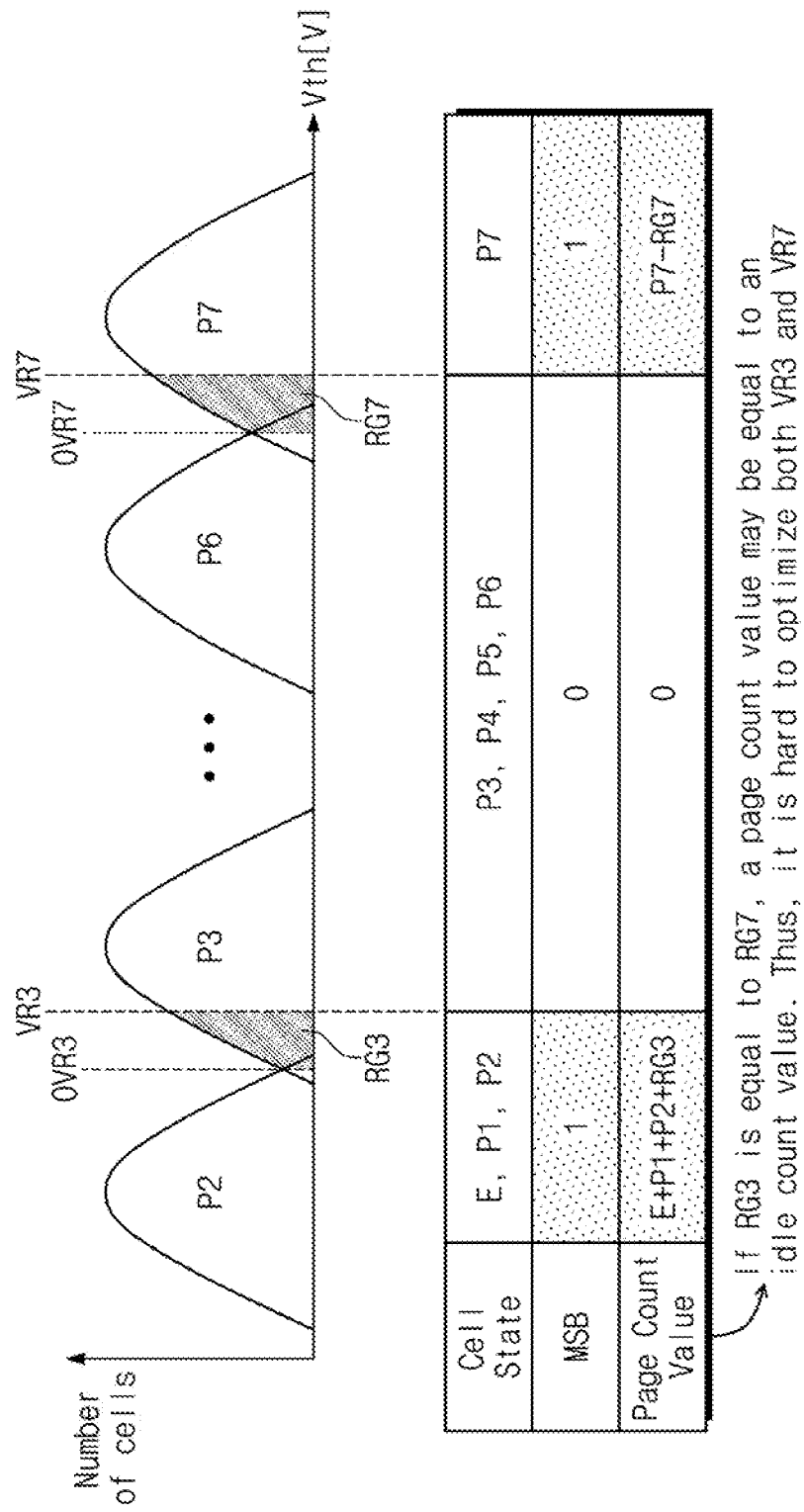

FIGS. 9A and 9B are diagrams describing page count values according to an example embodiment.

Referring to FIG. 9A, a graph of threshold voltage distributions and a page count value are illustrated. In the graph of FIG. 9A, a horizontal axis represents a threshold voltage, and a vertical axis represents the number of memory cells.

The third read voltage VR3 and the seventh read voltage VR7 may be lower than a third optimized read voltage OVR3 and a seventh optimized read voltage OVR7, respectively.

In an example embodiment, a width of a third region RG3 may be equal or similar to a width of a seventh region RG7. For example, the third and seventh read voltages VR3 and VR7 may not be default read voltages at the initial time. The third and seventh read voltages VR3 and VR7 may be read voltages optimized at any time before threshold voltage distributions illustrated in FIG. 9A are formed. As the third and seventh read voltages VR3 and VR7 are insufficiently or excessively adjusted through read voltage optimization previously performed, at a current time, the width of the third region RG3 may be equal or similar to the width of the seventh region RG7.

In this case, at the most significant bit MSB of the triple level cell TLC, because memory cells belonging to the third region RG3 and having the first bit value (e.g., bit value "1") are determined as having the second bit value (e.g., bit value "0") but memory cells belonging to the seventh region RG7 and having the second bit value are determined as having the first bit value, the number of memory cells having the first bit value from among all the memory cells may be uniform. In other words, even though a read voltage is not optimized, the page count value PCV may be equal or similar to the idle count value ICV, and it may be difficult to optimize all the third and seventh read voltages VR3 and VR7 at once.

Referring to FIG. 9B, a graph of threshold voltage distributions and a page count value are illustrated. In the graph of FIG. 9B, a horizontal axis represents a threshold voltage, and a vertical axis represents the number of memory cells.

The third read voltage VR3 and the seventh read voltage VR7 may be higher than the third optimized read voltage OVR3 and the seventh optimized read voltage OVR7, respectively.

In an example embodiment, a width of the third region RG3 may be equal or similar to a width of the seventh region RG7. As the third and seventh read voltages VR3 and VR7 are insufficiently or excessively adjusted through read voltage optimization previously performed, at a current time, the width of the third region RG3 may be equal or similar to the width of the seventh region RG7.

In this case, at the most significant bit MSB of the triple level cell TLC, because memory cells belonging to the third region RG3 and having the second bit value (e.g., bit value "0") are determined as having the first bit value (e.g., bit value "1") but memory cells belonging to the seventh region RG7 and having the first bit value are determined as having the second bit value, the number of memory cells having the first bit value from among all the memory cells may be uniform. In other words, even though a read voltage is not optimized, the page count value PCV may be equal or similar to the idle count value ICV, and it may be difficult to optimize all the third and seventh read voltages VR3 and VR7 at once.

As described with reference to FIGS. 9A and 9B, in the case of attempting to optimize all read voltages corresponding to one logical page, erroneously determined bits are mutually canceled out. For this reason, even though a read voltage is not optimized, the case where a page count value is similar to an idle count value may occur. In the case where a page count value is similar to an idle count value, it may be different to adjust a read voltage. To address this, there may be considered a way to optimize only a read voltage of a high voltage level in a state where a read voltage of a low voltage level (i.e., a read voltage corresponding to a threshold voltage distribution of a relatively small change) is fixed.

Figure 10A:
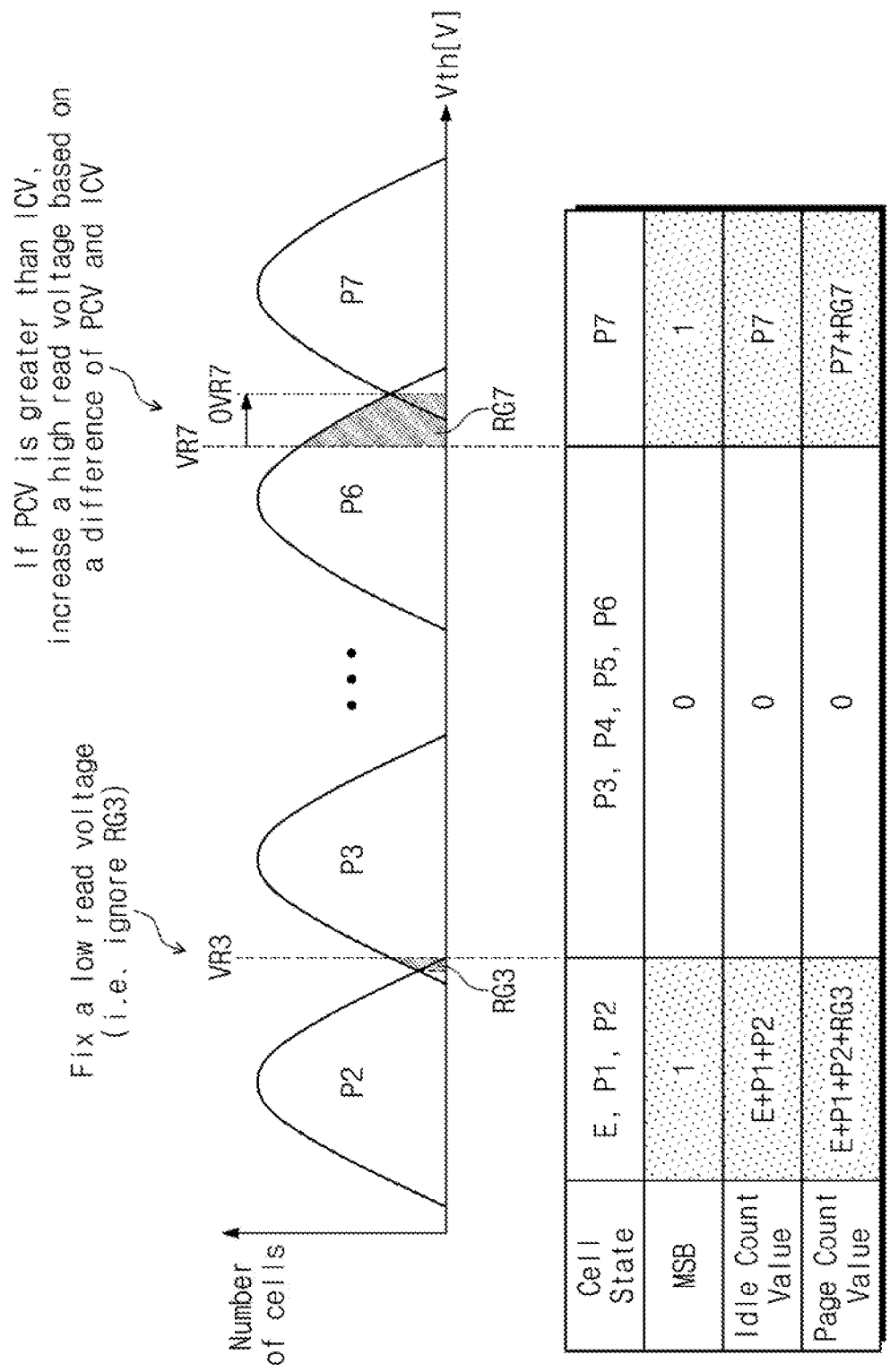
FIGS. 10A and 10B are diagrams describing a method of adjusting a read voltage, according to an example embodiment.
Figure 10B:
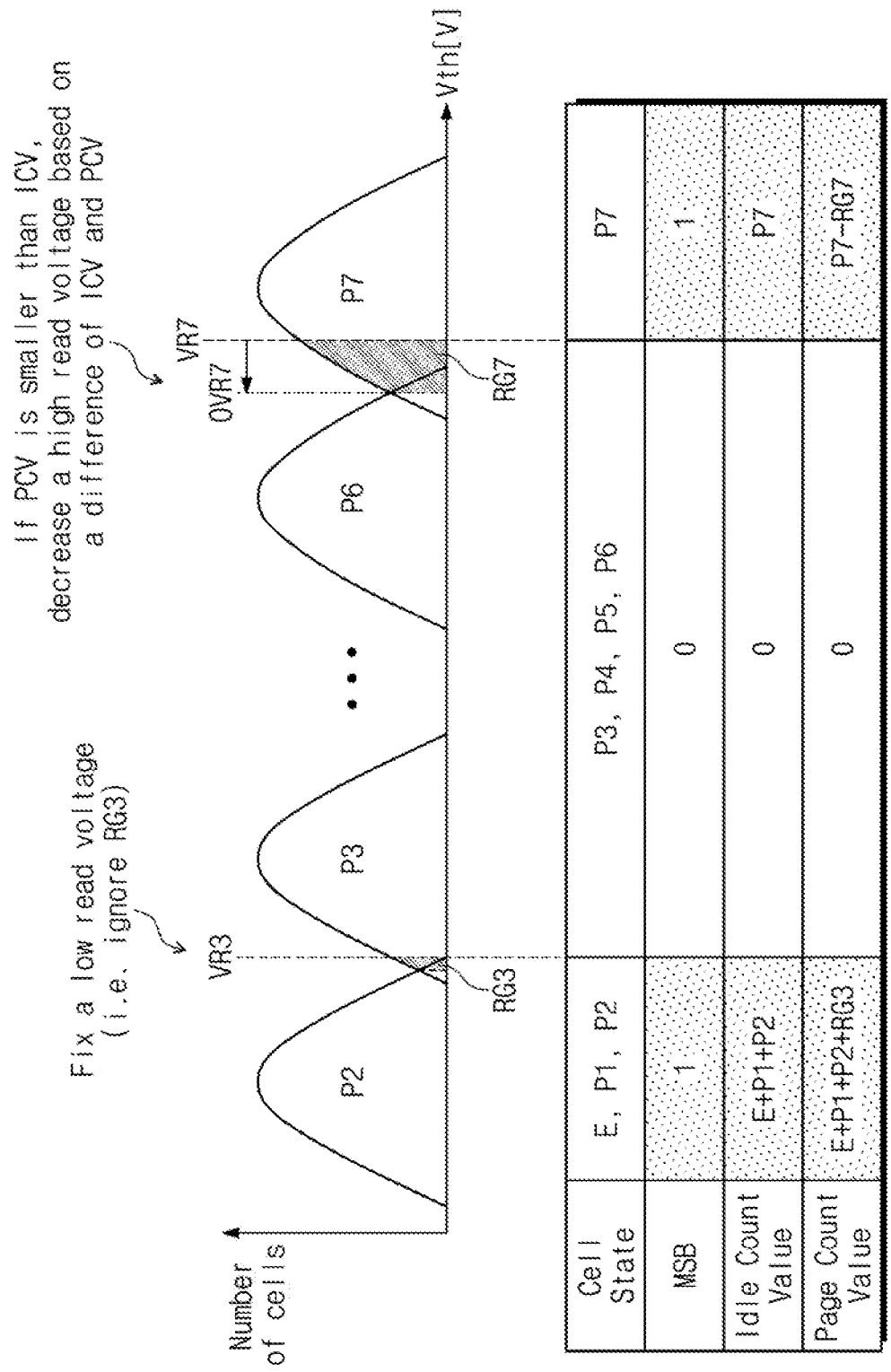

FIGS. 10A and 10B are diagrams describing a method of adjusting a read voltage, according to an example embodiment.

Referring to FIG. 10A, a graph of threshold voltage distributions and a page count value are illustrated. In the graph of FIG. 10A, a horizontal axis represents a threshold voltage, and a vertical axis represents the number of memory cells.

The third read voltage VR3 that is not an optimized read voltage may be fixed for optimization of the seventh read voltage VR7. For example, the storage controller 110 may ignore an error of memory cells corresponding to the third region RG3, and may optimize the seventh read voltage VR7.

In an example embodiment, when the page count value PCV is greater than the idle count value ICV, the storage controller 110 may increase a read voltage based on a difference between the page count value PCV and the idle count value ICV. For example, the storage controller may perform the DMA read operation based on the third and seventh read voltages VR3 and VR7 and may generate the page count value PCV corresponding to the most significant bit MSB. When the page count value PCV is greater than the idle count value ICV, the storage controller may determine the seventh optimized read voltage OVR7 by adding a voltage value corresponding to the difference between the page count value PCV and the idle count value ICV to the seventh read voltage VR7.

An example in which a read voltage is increased when the page count value PCV is greater than the idle count value ICV is described with reference to FIG. 10A, but, e.g., when the page count value PCV is greater than the idle count value ICV, unlike the embodiment of FIG. 10A, the storage controller 110 may decrease a read voltage depending on a bit value to be counted for a page count value, a logical page, a change of a read voltage, etc. For example, when the page count value PCV corresponding to the center significant bit CSB of the triple level cell TLC is greater than the idle count value ICV, the storage controller 110 may subtract a voltage value corresponding to a difference between the page count value PCV and the idle count value ICV from the sixth read voltage VR6 (refer to FIG. 5B).

Referring to FIG. 10B, a graph of threshold voltage distributions and a page count value are illustrated.

In the graphs of FIG. 10B, a horizontal axis represents a threshold voltage, and a vertical axis represents the number of memory cells.

The third read voltage VR3 that is not an optimized read voltage may be fixed for optimization of the seventh read voltage VR7.

In an example embodiment, when the page count value PCV is smaller than the idle count value ICV, the storage controller 110 may decrease a read voltage based on a difference between the page count value PCV and the idle count value ICV. For example, the storage controller 110 may perform the DMA read operation based on the third and seventh read voltages VR3 and VR7 and may generate the page count value PCV corresponding to the most significant bit MSB. When the page count value PCV is smaller than the idle count value ICV, the storage controller 110 may determine the seventh optimized read voltage OVR7 by subtracting a voltage value corresponding to the difference between the page count value PCV and the idle count value ICV from the seventh read voltage VR7.

An example in which a read voltage is decreased when the page count value PCV is smaller than the idle count value ICV is described with reference to FIG. 10B, but, e.g., when the page count value PCV is smaller than the idle count value ICV, unlike the embodiment of FIG. 10B, the storage controller 110 may increase a read voltage depending on a bit value to be counted for a page count value, a logical page, a change of a read voltage, etc. For example, when the page count value PCV corresponding to the center significant bit CSB of the triple level cell TLC is smaller than the idle count value ICV, the storage controller 110 may add a voltage value corresponding to a difference between the page count value PCV and the idle count value ICV to the sixth read voltage VR6 (refer to FIG. 5B).

Figure 11:
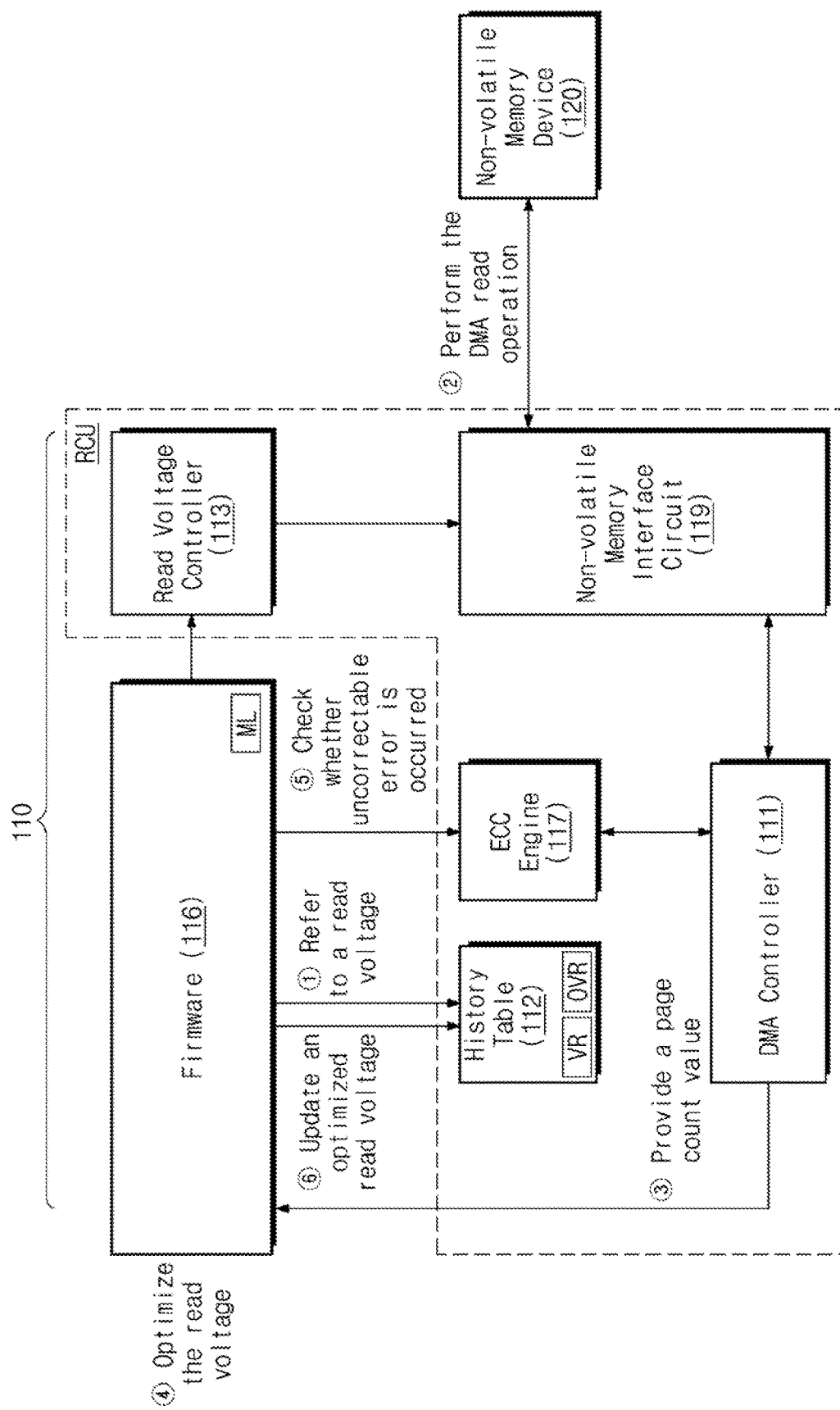
FIG. 11 is a diagram describing an operation method of a storage device according to an example embodiment.

FIG. 11 is a diagram describing an operation method of a storage device according to an example embodiment.

An operation method of the storage device 100 according to an example embodiment will be described with reference to FIG. 11.

The storage device 100 may include the storage controller 110 and the non-volatile memory device 120.

The storage controller 110 may include the firmware 116 and a read voltage control unit RCU.

The firmware 116 may control overall operations of the read voltage control unit RCU.

The read voltage control unit RCU may include the DMA controller 111, the history table 112, the read voltage controller 113, the ECC engine 117, and the non-volatile memory interface circuit 119.

The firmware 116 may refer to the history table 112. The history table 112 may store information about the read voltage VR and the optimized read voltage OVR. The read voltage VR may be a default read voltage optimized for a read operation at the initial time. The optimized read voltage OVR may be a read voltage determined by the firmware 116 after the read operation is performed for the first time. For example, in the case where the storage controller 110 performs the DMA read operation for the first time, the read voltage VR may exist, but the optimized read voltage OVR may not exist.

Through the read voltage controller 113, the firmware 116 may change a read voltage of the non-volatile memory device 120 to a read voltage referred to from the history table 112.

In an example embodiment in the case where the optimized read voltage OVR is not registered at the history table 112, through the read voltage controller 113, the firmware 116 may change the read voltage of the non-volatile memory device 120 to the read voltage VR of the history table 112.

In an example embodiment, in the case where the optimized read voltage OVR is registered at the history table 112, through the read voltage controller 113, the firmware 116 may change the read voltage of the non-volatile memory device 120 to the optimized read voltage OVR of the history table 112.

Under control of the firmware 116, the DMA controller 111 may perform the DMA read operation on data stored in the non-volatile memory device 120 through the non-volatile memory interface circuit 119. The DMA controller 111 may obtain raw data through the DMA read operation. The raw data may be data that are read from the non-volatile memory device 120 and do not experience error correction of the ECC engine 117.

The DMA controller 111 may generate a page count value corresponding to the raw data read through the DMA read operation. The page count value may exist every logical page, and may be a value obtained by counting the number of memory cells in the corresponding logical page, which have the first bit value. The DMA controller 111 may provide generated page count value to the firmware 116.

The firmware 116 may determine the optimized read voltage OVR based on the page count value obtained through the DMA controller 111. The optimized read voltage OVR may be a voltage optimized from the read voltage VR that is the default read voltage, or may be a voltage optimized from a read voltage that has been optimized in a previous DMA read operation.

In an example embodiment, the firmware 116 may determine the optimized read voltage OVR such that a difference between a page count value and an idle count value is minimized. For example, the firmware 116 may refer to a read voltage, which has been optimized in a previous DMA read operation, or the read voltage VR being the default read voltage from the history table 112. The firmware 116 may store an idle count value. The firmware 116 may determine the optimized read voltage OVR by adjusting a voltage value referred to from the history table 112 such that a difference between a page count value and an idle count value is minimized.

In an example embodiment, the firmware 116 may determine the optimized read voltage OVR by using a machine learning device ML. The machine learning device ML may generate a machine learning model for generating the optimized read voltage OVR. The machine learning device ML may determine the optimized read voltage based on the machine learning model and a page count value. The machine learning device ML will be described in more detail with reference to FIGS. 12 and 13.

The firmware 116 may manage the ECC engine 117. The ECC engine 117 may determine whether the raw data according to the DMA read operation have an uncorrectable error. The firmware 116 may check whether an error of the raw data is correctable through the ECC engine 117.

When it is determined that the error of the raw data is correctable, the firmware 116 may store information about the optimized read voltage OVR in the history table 112. For example, when a read voltage that has been optimized in a previous DMA read operation is present in the history table 112, the firmware 116 may update the optimized read voltage OVR. When a read voltage that has been optimized in a previous DMA read operation is absent from the history table 112, the firmware 116 may newly store information about the optimized read voltage OVR.

When it is determined that the error of the raw data is uncorrectable, the firmware 116 may perform the read retry based on a read retry voltage. When it is determined that raw data obtained through the read retry do not have an uncorrectable error, the firmware 116 may store information about a read retry voltage in the history table 112 as information about the optimized read voltage OVR.

Figure 12:
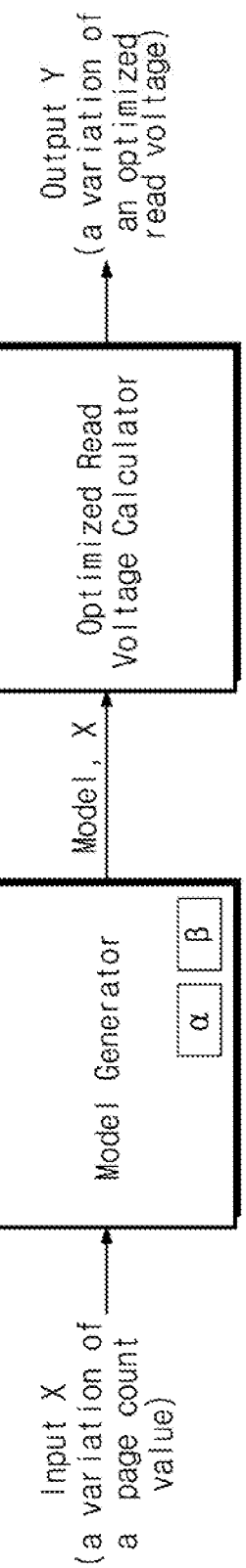
FIG. 12 is a block diagram describing a machine learning device of FIG. 11, according to an example embodiment.
Figure 13:
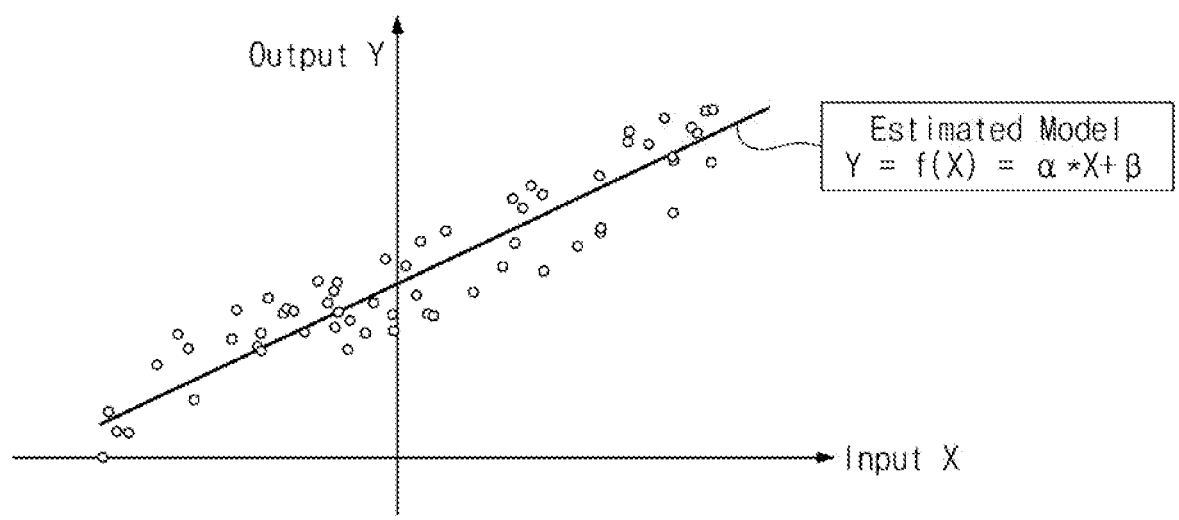
FIG. 13 is a diagram describing a machine learning model generator by a model generator of FIG. 12, according to an example embodiment.

FIG. 12 is a block diagram describing a machine learning device of FIG. 11, according to an example embodiment. FIG. 13 is a diagram describing a machine learning model generator by a model generator of FIG. 12, according to an example embodiment.

The machine learning device ML included in the firmware 116 will be described with reference to FIGS. 11, 12, and 13. For better understanding, the machine learning device ML will be described as software that is included in the firmware 116 stored in a memory, but, e.g., machine learning device ML may be implemented by separate hardware or a combination of hardware and software.

The machine learning device ML may receive an input "X", and may generate an output "Y". The input "X" may be a variation of a page count value obtained through the DMA controller 111. For example, the input "X" may be a difference between a previous page count value and a current page count value. When a previous page count value does not exist, the input "X" may be a difference between an idle count value and a current page count value.

The output "Y" may be a variation of an optimized read voltage. For example, the output "Y" may be a difference between a previous optimized read voltage and a current optimized read voltage. When a previous optimized read voltage does not exist, the output "Y" may be a difference between the read voltage VR being a default read voltage and a current optimized read voltage OVR. The firmware 116 may determine the optimized read voltage OVR by adding a voltage value referred to from the history table 112 to the output "Y".

The machine learning device ML may include a model generator and an optimized read voltage calculator. The model generator may include a first parameter α and a second parameter β. In an example embodiment, at a test level, the model generator may determine the first parameter α and the second parameter β through a machine learning algorithm, based on a training data set that is a pair of variations: a variation of a page count value and a variation of an experimentally obtained optimized read voltage.

FIG. 13 illustrates an example of a plurality of training data sets and an estimated machine learning model. One training data set may include a pair of input "X" and output "Y". In FIG. 13, a horizontal axis represents a magnitude of the input "X". In FIG. 13, a vertical axis represents a magnitude of the output "Y".

The model generator may generate a machine learning model, in which an estimated error (e.g., a distance between a linear graph of the estimated machine learning model and a training data set) is minimized, based on the plurality of training data sets. To generate the machine learning model may mean to determine the first parameter α and the second parameter β.

Referring again to FIG. 12, the model generator may include the first parameter α and the second parameter β determined through the machine learning algorithm. The model generator may receive the input "X". The model generator may output the machine learning model, which is based on the first parameter α and the second parameter β, and the input "X" to the optimized read voltage calculator.

The optimized read voltage calculator may input the input "X" to the machine learning model, which is based on the first parameter α and the second parameter β. For example, the estimated machine learning model may be expressed by the following Equation:

$$Y = \alpha * X + \beta$$

In the Equation above, "X" denotes an input value, "α" denotes the first parameter α of the model generator, "β" denotes the second parameter β of the model generator, and "Y" denotes an output value.

The optimized read voltage calculator may determine the output "Y" based on the machine learning model and the input "X".

Figure 14:
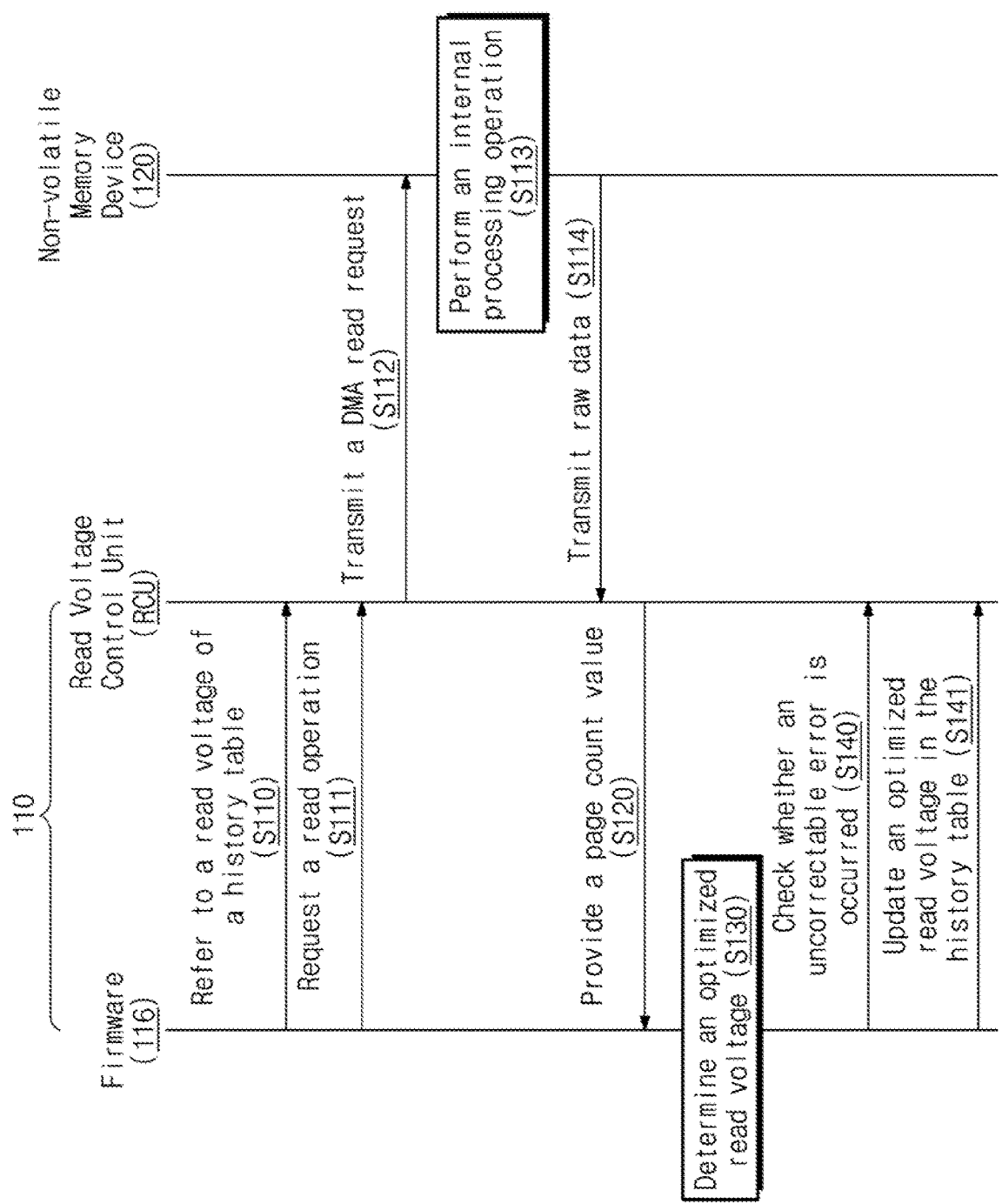
FIG. 14 is a flowchart describing an operation method of a storage device according to an example embodiment.

FIG. 14 is a flowchart describing an operation method of a storage device according to an example embodiment.

An operation method of a storage device will be described with reference to FIG. 14. The storage device may correspond to the storage device 100 of FIG. 11.

Referring to FIGS. 11 and 14, the storage device 100 may include the storage controller 110 and the non-volatile memory device 120. The storage controller 110 may include the firmware 116 and the read voltage control unit RCU.

In operation S110, the firmware 116 may refer to a read voltage of a history table of the read voltage control unit RCU. In an example embodiment, the read voltage control unit RCU may change a read voltage of the non-volatile memory device 120 to a read voltage of the history table under control of the firmware 116.

In operation S111, the firmware 116 may request a read operation from the read voltage control unit RCU.

In operation S112, the read voltage control unit RCU may transmit a DMA read request to the non-volatile memory device 120.

In operation S113, the non-volatile memory device 120 may perform an internal processing operation based on the DMA read request. The internal processing operation may mean an operation of preparing a data output according to the DMA read operation. For example, the internal processing operation may include an operation of controlling sense amplification and storing data in a page buffer in units of page.

In operation S114, the non-volatile memory device 120 may transmit raw data to the read voltage control unit RCU. The raw data that are data output from the non-volatile memory device 120 may mean data that do not experience error correction of an ECC engine. To transmit the raw data in operation S114 may be referred to as "performing the DMA read operation".

In operation S120, the read voltage control unit RCU may generate a page count value based on the raw data in operation S114, and may provide the page count value to the firmware 116. The page count value may be a value that is obtained by counting the number of memory cells having the first bit value from among memory cells read in units of logical page.

In operation S130, the firmware 116 may determine an optimized read voltage based on the page count value.

In operation S140, the firmware 116 may determine whether the raw data have an uncorrectable error, through an ECC engine of the read voltage control unit RCU. When it is determined in operation S140 that the raw data do not have an uncorrectable error, the storage device may perform operation S141.

In operation S141, the firmware 116 may update the history table of the read voltage control unit RCU with the optimized read voltage. Thus, the firmware 116 may determine an optimized read voltage based on a page count value of raw data from which an uncorrectable error is absent and may update the history table with the optimized read voltage.

Figure 15:
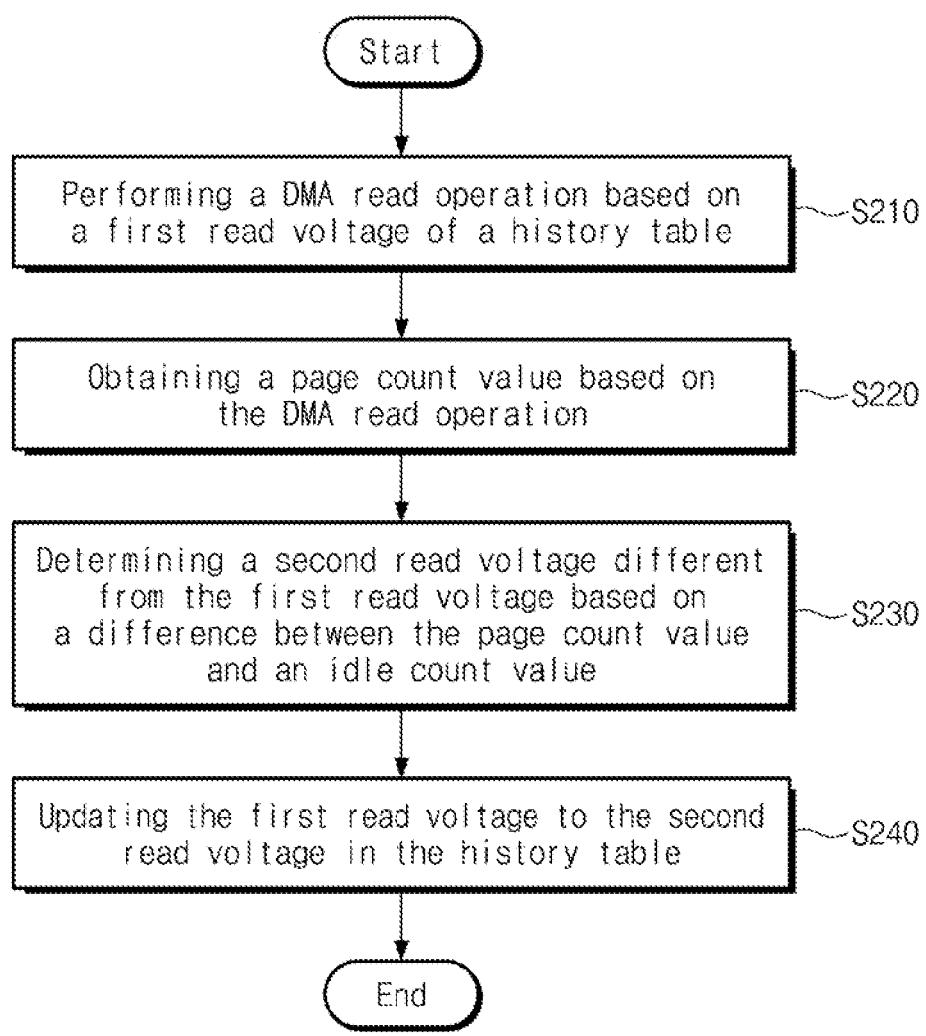
FIG. 15 is a flowchart describing an operation method of a storage controller according to an example embodiment.

FIG. 15 is a flowchart describing an operation method of a storage controller according to an example embodiment.

An operation method of a storage controller according to an example embodiment will be described with reference to FIG. 15. The storage controller may correspond to the storage controller 110 of FIG. 11. The storage controller may communicate with a non-volatile memory device.

In operation S210, the storage device may perform a DMA read operation on data stored in the non-volatile memory device, based on a first read voltage of a history table. The first read voltage may be a default read voltage stored in the history table or may be a read voltage optimized in a previous DMA read operation.

In operation S220, the storage controller may obtain a page count value, based on the DMA read operation. The page count value may be a value obtained by counting the number of memory cells having the first bit value from among memory cells belonging to a logical page of raw data read through the DMA read operation.

In operation S230, the storage controller may determine a second read voltage different from the first read voltage based on a difference between the page count value and an idle count value, without an additional read operation for data stored in the non-volatile memory device. The idle count value may indicate the number of memory cells having the first bit value from among memory cells belonging to a logical page corresponding to the first read voltage at the initial time. The second read voltage may be a read voltage optimized with respect to the logical page corresponding to the first read voltage at a time when the DMA read operation in operation S210 is performed.

In operation S240, the storage controller may update the history table with the second read voltage, that is, may change the first read voltage of the history table to the second read voltage. For example, when the first read voltage is a read voltage optimized in a previous DMA read operation, the storage controller may change the first read voltage of the history table to the second read voltage. For example, when the first read voltage is a default read voltage, the storage controller may newly store the second read voltage in the history table as an optimized read voltage.

According to the present example embodiment, an optimized read voltage may be determined based on a page count value generated from the DMA read operation, and may be stored in the history table. The read voltage stored in the history table may be used in a next DMA read operation. Because the next DMA read operation is performed based on the optimized read voltage, the probability that an uncorrectable error occurs may decrease. Thus, the storage controller according to an example embodiment may prevent the occurrence of an uncorrectable error without an additional read operation.

Figure 16:
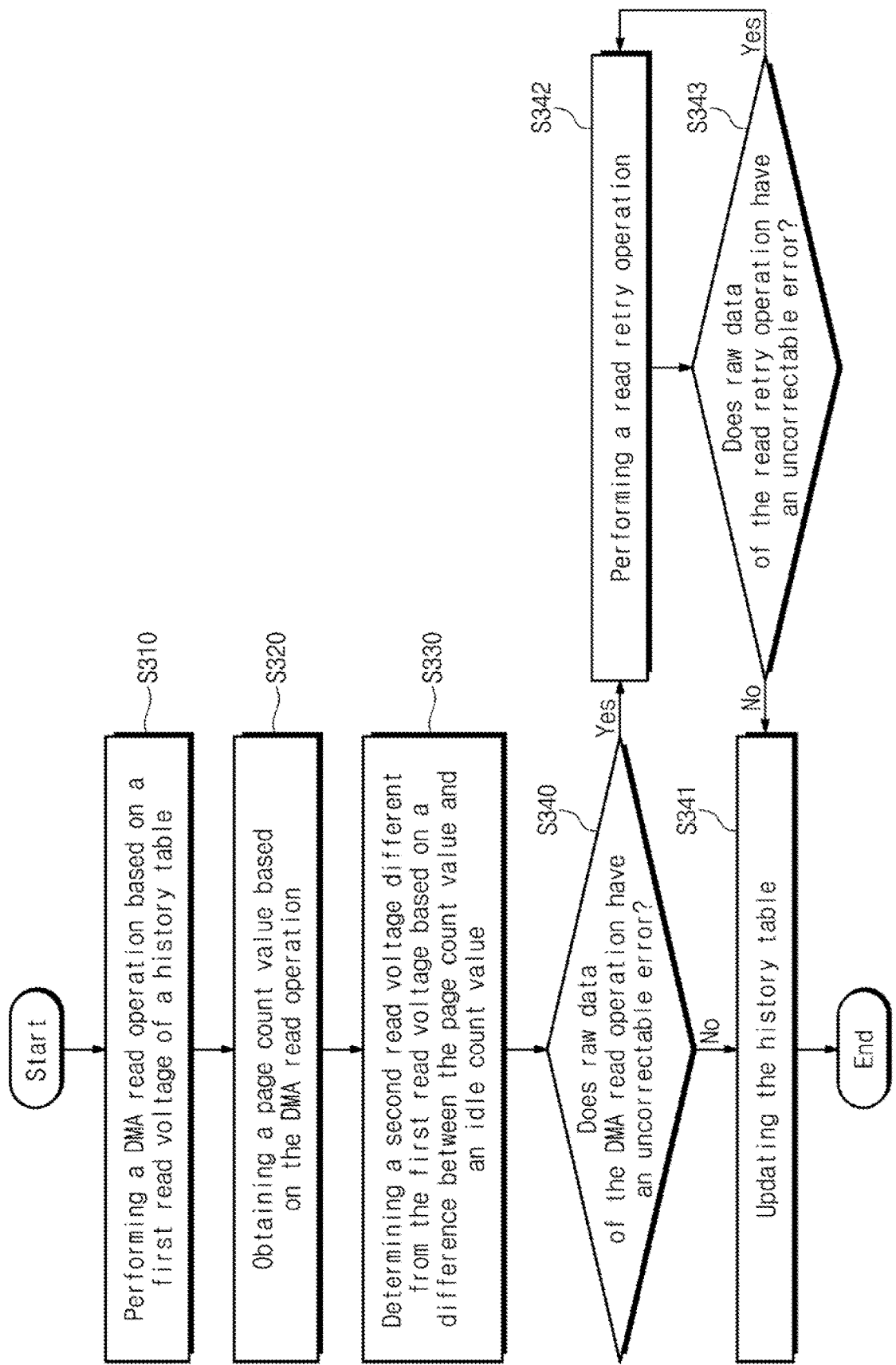
FIG. 16 is a flowchart describing an operation method of a storage controller according to an example embodiment.

FIG. 16 is a flowchart describing an operation method of a storage controller according to an example embodiment.

An operation method of a storage controller according to an example embodiment will be described with reference to FIG. 16. The storage controller may correspond to the storage controller 110 of FIG. 11. The storage controller may communicate with a non-volatile memory device.

Operation S310, operation S320, and operation S330 are similar to operation S210, operation S220, and operation S230 of FIG. 15, and thus, additional description will be omitted to avoid redundancy.

After operation S330, the storage controller may perform operation S340. In operation S340, the storage controller may determine whether the raw data obtained by the DMA read operation in operation S310 have an uncorrectable error.

When it is determined in operation S340 that the raw data do not have an uncorrectable error ("No"), the storage controller may perform operation S341.

In operation S341, the storage controller may determine the first read voltage of the history table as the second read voltage determined in operation S330.

When it is determined in operation S340 that the raw data have an uncorrectable error ("Yes"), the storage controller may perform operation S342.

In operation S342, the storage controller may perform a read retry operation based on a read retry voltage. The read retry operation may refer to an operation of changing a read voltage to an optimized read voltage and again perform a read operation by using the optimized read voltage.

In an example embodiment, the storage controller may perform the read retry operation, may generate a page count value of raw data obtained by the read retry operation, and may generate an optimized read voltage based on the page count value.

In operation S343, the storage controller may determine whether the raw data obtained by the read retry operation have an uncorrectable error. When it is determined in operation S343 that the raw data do not have an uncorrectable error ("No"), the storage controller may perform operation S341. For example, when it is determined that the raw data of the read retry operation do not have an uncorrectable error, in operation S341, the storage controller may update the history table with the read voltage optimized based on the read retry operation.

When it is determined in operation S343 that the raw data have an uncorrectable error ("Yes"), the storage controller may again perform operation S342. For example, the storage controller may perform a first read retry operation based on a first read retry voltage; when raw data of the first read retry operation have an uncorrectable error, the storage controller may determine a second read retry voltage based on a page count value of the raw data of the first read retry operation, and may perform a second read retry operation based on the second read retry voltage.

Figure 17:
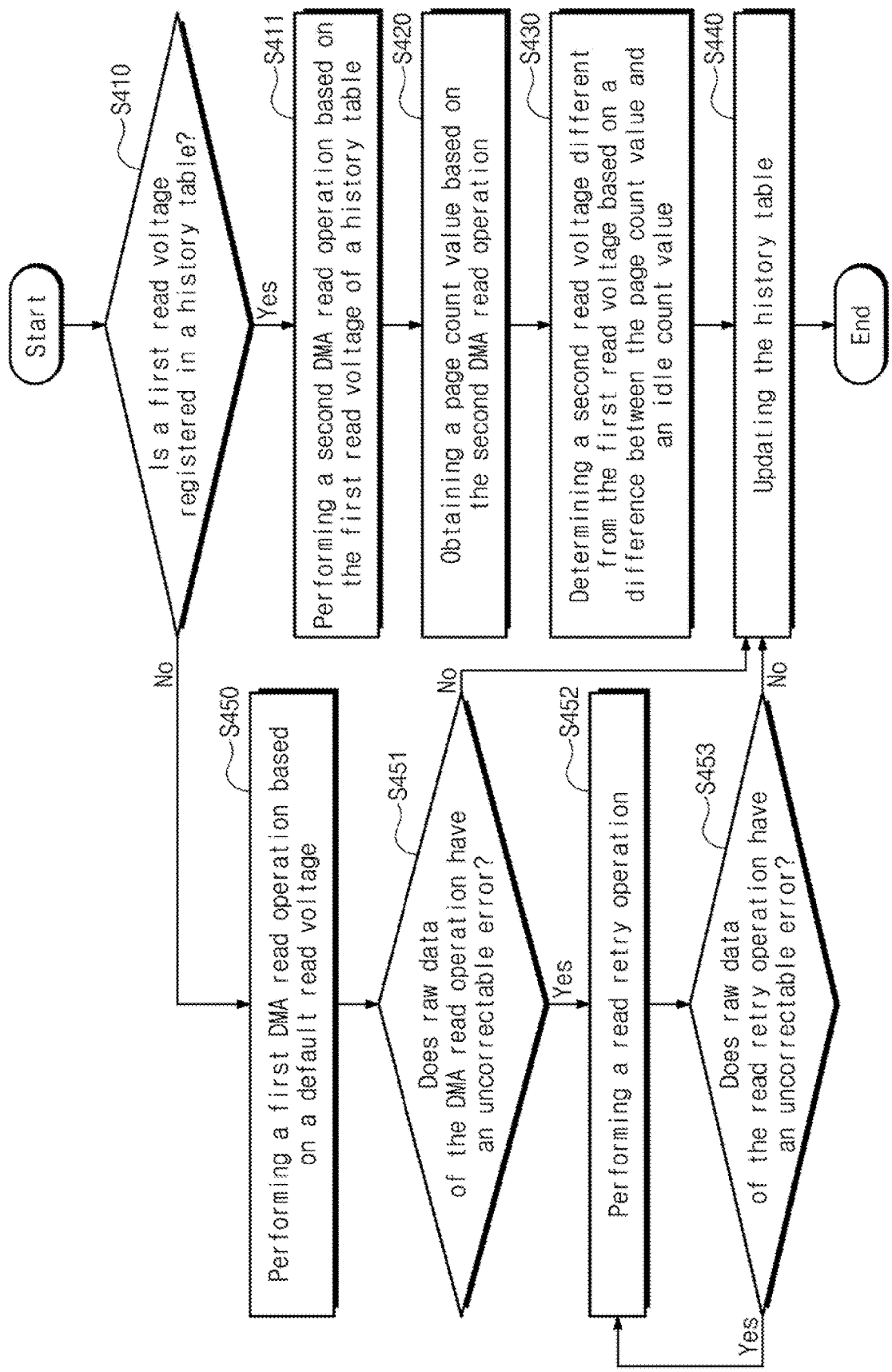
FIG. 17 is a flowchart describing an operation method of a storage controller according to an example embodiment.

FIG. 17 is a flowchart describing an operation method of a storage controller according to an example embodiment.

An operation method of a storage controller according to an example embodiment will be described with reference to FIG. 17. The storage controller may correspond to the storage controller 110 of FIG. 11. The storage controller may communicate with a non-volatile memory device.

In operation S410, the storage controller may determine whether a first read voltage is registered at the history table. The first read voltage may be a read voltage optimized by a previous DMA read operation. For example, when a read voltage optimized by a previous DMA read operation exists, the storage controller may determine that the first read voltage is registered at the history table. When a read voltage optimized by a previous DMA read operation does not exist, the storage controller may determine that the first read voltage is not registered at the history table.

When it is determined in operation S410 that the first read voltage is registered ("Yes"), the storage controller may perform operation S411, operation S420, operation S430, and operation S440.

For example, when a first read voltage optimized by a first DMA read operation exists, the storage controller may perform a second DMA read operation based on the first read voltage. The storage controller may update the first read voltage of the history table based on the second DMA read operation. Operation S411, operation S420, and operation S430 are similar to operation S210, operation S220, and operation S230 of FIG. 15, and thus, additional description will be omitted to avoid redundancy.

When it is determined in operation S410 that the first read voltage is not registered ("No"), the storage controller may perform operation S450.

In operation S450, the storage controller may perform the first DMA read operation based on a default read voltage. In an example embodiment, in operation S450, the storage controller may obtain raw data through the first DMA read operation, may generate a page count value of the raw data, and may determine an optimized read voltage based on the page count value.

In operation S451, the storage controller may determine whether the raw data obtained by the first DMA read operation have an uncorrectable error. When it is determined in operation S451 that the raw data of the first DMA read operation do not have an uncorrectable error ("No"), the storage controller may perform operation S440.

For example, when it is determined that the raw data of the first DMA read operation do not have an uncorrectable error, in operation S440, the storage controller may update the history table with the read voltage optimized based on the first DMA read operation.

When it is determined in operation S451 that the raw data of the first DMA read operation have an uncorrectable error ("Yes"), the storage controller may perform operation S452.

In operation S452, the storage controller may perform a read retry operation based on a read retry voltage. In an example embodiment, in operation S452, the storage controller may obtain raw data through the read retry operation, may generate a page count value of the raw data, and may determine an optimized read voltage based on the page count value.

In operation S453, the storage controller may determine whether the raw data obtained by the read retry operation have an uncorrectable error. When it is determined in operation S453 that the raw data of the read retry operation do not have an uncorrectable error ("No"), the storage controller may perform operation S440. For example, when it is determined that the raw data of the read retry operation do not have an uncorrectable error, in operation S440, the storage controller may update the history table with the read voltage optimized based on the read retry operation.

When it is determined in operation S453 that the raw data of the read retry operation have an uncorrectable error ("Yes"), the storage controller may perform operation S452. For example, the storage controller may perform a first read retry operation based on a first read retry voltage; when raw data of the first read retry operation have an uncorrectable error, the storage controller may determine a second read retry voltage based on a page count value of the raw data of the first read retry operation, and may perform a second read retry operation based on the second read retry voltage.

Figure 18:
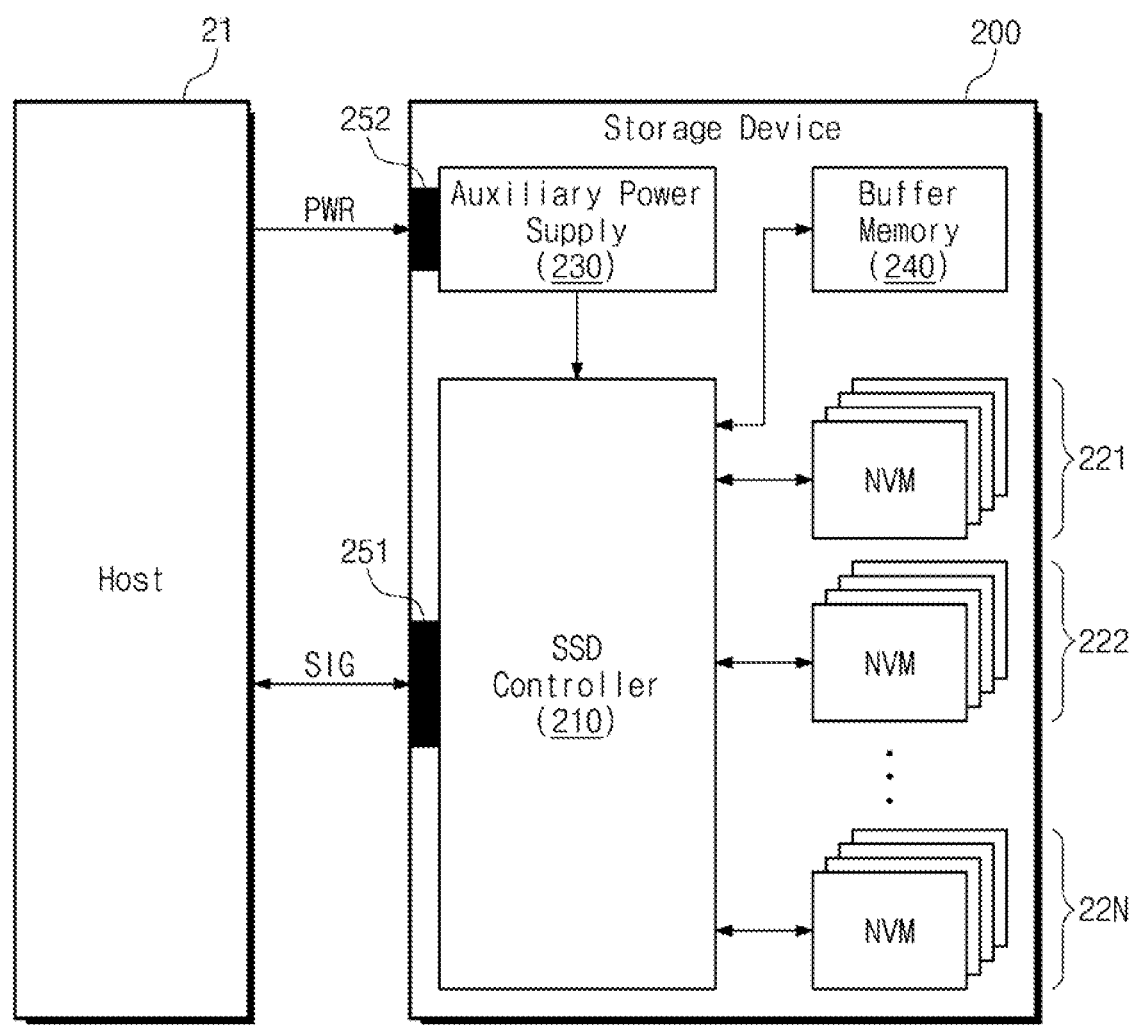
FIG. 18 is a block diagram of a solid state drive system to which a storage device according to an example embodiment is applied.

FIG. 18 is a block diagram of a solid state drive (SSD) system to which a storage device according to an example embodiment is applied.

Referring to FIG. 18, an SSD system 20 may include a host 21 and a storage device 200.

The storage device 200 may exchange a signal SIG with the host 21 through a signal connector 251 and may receive a power PWR through a power connector 252. The storage device 200 may correspond to the storage device 100 of FIG. 1 or the storage device 100 of FIG. 11. An operation method of the storage device 200 may correspond to the operation method of FIG. 14. An operation method of an SSD controller 210 may correspond to the operation method of FIG. 15, 16, or 17.

The storage device 200 may include the SSD controller 210, a plurality of non-volatile memories 221 to 22N, an auxiliary power supply 230, and a buffer memory 240.

The SSD controller 210 may control the plurality of non-volatile memories 221 to 22N in response to the signal SIG from the host 21. The plurality of non-volatile memories 221 to 22N may operate under control of the SSD controller 210.

In an example embodiment, the SSD controller 210 may perform the DMA read operation with the plurality of non-volatile memories 221 to 22N, may determine an optimized read voltage based on a page count value, and may update a history table with the optimized read voltage. When data read from the plurality of non-volatile memories 221 to 22N through the DMA read operation have an uncorrectable error, the SSD controller 210 may perform a read retry operation based on the optimized read voltage of the history table.

The auxiliary power supply 230 may be connected with the host 21 through the power connector 252. The auxiliary power supply 230 may be charged by the power PWR from the host 21. When the power is not smoothly supplied from the host 21, the auxiliary power supply 230 may provide a power for driving the SSD system 20.

The buffer memory 240 may be used as a buffer memory of the storage device 200.

By way of summation and review, as memory cells of the non-volatile memory device are programmed based on bit values of data, the memory cells may form threshold voltage distributions. After a considerable time passes from a time when data are stored in the non-volatile memory device, that is, at a retention time, threshold voltage distributions of the memory cells may be lower than the threshold voltage distributions formed when the memory cells are programmed. The change of the threshold voltage distributions may cause the loss of data and the reduction of reliability in the non-volatile memory device. A general memory system may obtain a count value through a separate, additional read operation being a shift read operation and calculate a shift amount through a logical operation of comparing a count value stored in a history table with the obtained count value. The separate, additional read operation may result in an increase of an input/output (I/O) load, and the logical operation for calculating a change of threshold voltage distributions of memory cells may result in an increase of computational burden.

As described above, embodiments may provide an approach that optimizes a read voltage, without an additional read operation for obtaining information of threshold voltage distributions and a separate logical operation.

As described above, embodiments relate to optimization of a read voltage, and more particularly, relate to an operation method of a storage controller using a history table storing a count value of a direct memory access, and a storage device including the storage controller.

An operation method of a storage controller according to an embodiment may use a history table storing a count value of a direct memory access, and a storage device including the storage controller are provided.

Also, an operation method of a storage controller, which is capable of improving a data processing speed and reliability by updating a history table with a read voltage corresponding to a read operation, in which an uncorrectable error does not occur, without an additional read operation, and a storage device including the storage controller may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An operation method of a storage controller that communicates with a non-volatile memory device, the method comprising:
performing a first direct memory access (DMA) read operation on data stored in the non-volatile memory device, based on a first read voltage of a history table;
obtaining a page count value, based on the first DMA read operation;
determining a second read voltage different from the first read voltage based on a difference between the page count value and an idle count value, without an additional read operation for the data stored in the non-volatile memory device; and
updating the history table by changing the first read voltage of the history table to the second read voltage.

2. The method as claimed in claim 1, wherein:
the idle count value indicates a number of memory cells having a first bit value from among memory cells belonging to a page corresponding to the first read voltage at an initial time,
the page count value indicates a number of memory cells having the first bit value from among memory cells belonging to the page corresponding to the first read voltage at a time when the first DMA read operation is performed, and
the second read voltage is a read voltage optimized with respect to the page corresponding to the first read voltage at the time when the first DMA read operation is performed.

3. The method as claimed in claim 1, wherein the performing of the first DMA read operation on the data stored in the non-volatile memory device based on the first read voltage of the history table includes:
performing the first DMA read operation on the data stored in the non-volatile memory device, based on the first read voltage and a third read voltage smaller than the first read voltage,
wherein the first and third read voltages correspond to a same page.

4. The method as claimed in claim 3, wherein the determining of the second read voltage different from the first read voltage based on the difference between the page count value and the idle count value, without the additional read operation for the data stored in the non-volatile memory device includes:
determining the second read voltage as being a result of optimizing the first read voltage, with the third read voltage fixed, based on the difference between the page count value and the idle count value, without the additional read operation for the data stored in the non-volatile memory device.

5. The method as claimed in claim 1, wherein the determining of the second read voltage different from the first read voltage based on the difference between the page count value and the idle count value, without the additional read operation for the data stored in the non-volatile memory device includes:
when a value obtained by subtracting the page count value from the idle count value is a negative number, determining the second read voltage by adding a voltage value corresponding to the difference between the page count value and the idle count value to the first read voltage; and
when the value obtained by subtracting the page count value from the idle count value is a positive number, determining the second read voltage by subtracting the voltage value corresponding to the difference between the page count value and the idle count value from the first read voltage.

6. The method as claimed in claim 1, wherein the determining of the second read voltage different from the first read voltage based on the difference between the page count value and the idle count value, without the additional read operation for the data stored in the non-volatile memory device includes:
when a value obtained by subtracting the page count value from the idle count value is a negative number, determining the second read voltage by subtracting a voltage value corresponding to the difference between the page count value and the idle count value from the first read voltage; and
when the value obtained by subtracting the page count value from the idle count value is a positive number, determining the second read voltage by adding the voltage value corresponding to the difference between the page count value and the idle count value to the first read voltage.

7. The method as claimed in claim 1, wherein:
the non-volatile memory device include a plurality of memory cells, each of which has one of an erase state and first to seventh programming states, and
each of the erase state and the first to seventh programming states indicates a first bit value or a second bit value within a page corresponding to the first read voltage.

8. The method as claimed in claim 7, wherein:
the page corresponding to the first read voltage is a first logical page indicating a most significant bit of a triple level cell, and
the first read voltage is a voltage for distinguishing the sixth programming state of an initial time from the seventh programming state of the initial time.

9. The method as claimed in claim 7, wherein:
the page corresponding to the first read voltage is a second logical page indicating a center significant bit of a triple level cell, and
the first read voltage is a voltage for distinguishing the fifth programming state of an initial time from the sixth programming state of the initial time.

10. The method as claimed in claim 7, wherein:
the page corresponding to the first read voltage is a third logical page indicating a least significant bit of a triple level cell, and
the first read voltage is a voltage for distinguishing the fourth programming state of an initial time from the fifth programming state of the initial time.

11. The method as claimed in claim 1, wherein the determining of the second read voltage different from the first read voltage based on the difference between the page count value and the idle count value, without the additional read operation for the data stored in the non-volatile memory device includes:
determining, by a machine learning device of the storage controller, the second read voltage based on the first read voltage and a machine learning model generated by the machine learning device.

12. The method as claimed in claim 1, wherein the updating of the history table by changing the first read voltage of the history table to the second read voltage includes:
determining whether first raw data read by the first DMA read operation include an uncorrectable error; and
when it is determined that the uncorrectable error is absent from the first raw data, updating the first read voltage of the history table with the second read voltage.

13. The method as claimed in claim 1, wherein the performing of the first DMA read operation on the data stored in the non-volatile memory device based on the first read voltage of the history table includes:
determining whether the first read voltage is registered at the history table; and
when it is determined that the first read voltage is registered at the history table, performing the first DMA read operation on the data stored in the non-volatile memory device, based on the first read voltage.

14. The method as claimed in claim 1, wherein the performing of the first DMA read operation on the data stored in the non-volatile memory device based on the first read voltage of the history table includes:
- determining whether the first read voltage is registered at the history table;
- when it is determined that the first read voltage is not registered at the history table, performing a second DMA read operation based on a default read voltage;
- determining whether second raw data read by the second DMA read operation include an uncorrectable error; and
- when it is determined that the uncorrectable error is absent from the second raw data read by the second DMA read operation, updating the history table such that the default read voltage is set as the first read voltage.

15. An operation method of a storage controller that communicates with a non-volatile memory device, the method comprising:
- determining whether a first read voltage is registered at a history table;
- when it is determined that the first read voltage is registered at the history table, performing a first direct memory access (DMA) read operation on data stored in the non-volatile memory device, based on the first read voltage;
- obtaining a page count value, based on the first DMA read operation;
- determining a second read voltage different from the first read voltage based on a difference between the page count value and an idle count value, without an additional read operation for the data stored in the non-volatile memory device; and
- updating the history table by changing the first read voltage of the history table to the second read voltage.

16. The method as claimed in claim 15, wherein the updating of the history table by changing the first read voltage of the history table to the second read voltage includes:
- determining whether first raw data read by the first DMA read operation include an uncorrectable error; and
- when it is determined that the uncorrectable error is absent from the first raw data, updating the first read voltage of the history table with the second read voltage.

17. The method as claimed in claim 15, wherein the updating of the history table by changing the first read voltage of the history table to the second read voltage includes:
- determining whether first raw data read by the first DMA read operation include an uncorrectable error;
- when it is determined that the first raw data include the uncorrectable error, performing a first read retry operation based on a first read retry voltage;
- determining whether second raw data read by the first read retry operation include an uncorrectable error;
- when it is determined that the uncorrectable error is absent from the second raw data, updating the first read voltage of the history table with the first read retry voltage; and
- when it is determined that the second raw data include the uncorrectable error, performing a second read retry operation based on a second read retry voltage.

18. The method as claimed in claim 15, wherein the determining whether the first read voltage is registered at the history table includes:
- when it is determined that the first read voltage is not registered at the history table, performing a second DMA read operation based on a default read voltage;
- determining whether third raw data read by the second DMA read operation include an uncorrectable error; and
- when it is determined that the uncorrectable error is absent from the third raw data, updating the history table such that the default read voltage is set as the first read voltage.

19. The method as claimed in claim 15, wherein the determining whether the first read voltage is registered at the history table includes:
- when it is determined that the first read voltage is not registered at the history table, performing a second DMA read operation based on a default read voltage;
- determining whether third raw data read by the second DMA read operation include an uncorrectable error;
- when it is determined that the third raw data include the uncorrectable error, performing a third read retry operation based on a third read retry voltage;
- determining whether fourth raw data read by the third read retry operation include an uncorrectable error;
- when it is determined that the uncorrectable error is absent from the fourth raw data, updating the history table such that the third read retry voltage is set as the first read voltage; and
- when it is determined that the fourth raw data include the uncorrectable error, performing a fourth read retry operation based on a fourth read retry voltage.

20. A storage device, comprising:
- a non-volatile memory device including a plurality of memory cells for storing data; and
- a storage controller configured to communicate with the non-volatile memory device, the storage controller including:
- a history table configured to store information about a first read voltage;
- a direct memory access (DMA) controller configured to perform a first DMA read operation on the data based on the first read voltage and to generate a page count value corresponding to the first DMA read operation;
- an error correction code (ECC) engine configured to determine whether raw data read by the first DMA read operation include an uncorrectable error; and
- a memory configured to store firmware, the firmware being configured to:
- control the first DMA read operation of the DMA controller;
- determine a second read voltage, which is a result of optimizing the first read voltage, based on a difference between the page count value and an idle count value; and
- when the uncorrectable error is absent from the raw data, update the history table such that the first read voltage is changed to the second read voltage.

* * * * *